(12) United States Patent
Toizumi et al.

(10) Patent No.: US 10,712,374 B2
(45) Date of Patent: Jul. 14, 2020

(54) DATA PROCESSING DEVICE, DATA PROCESSING METHOD, AND NON-TRANSITORY STORAGE MEDIUM

(71) Applicant: NEC CORPORATION, Tokyo (JP)

(72) Inventors: Takahiro Toizumi, Tokyo (JP); Eisuke Saneyoshi, Tokyo (JP); Ryota Suzuki, Tokyo (JP); Shigeru Koumoto, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 295 days.

(21) Appl. No.: 15/562,540

(22) PCT Filed: Jan. 8, 2016

(86) PCT No.: PCT/JP2016/050494
§ 371 (c)(1),
(2) Date: Sep. 28, 2017

(87) PCT Pub. No.: WO2016/157927
PCT Pub. Date: Oct. 6, 2016

(65) Prior Publication Data
US 2018/0088158 A1    Mar. 29, 2018

(30) Foreign Application Priority Data

Mar. 31, 2015   (JP) ................ 2015-071070

(51) Int. Cl.
*G01R 21/06*      (2006.01)
*G06N 20/00*      (2019.01)
(Continued)

(52) U.S. Cl.
CPC .......... *G01R 21/06* (2013.01); *G06N 5/04* (2013.01); *G06N 20/00* (2019.01); *G06Q 50/06* (2013.01)

(58) Field of Classification Search
CPC .......... G01R 21/06; G06N 20/00; G06N 5/04; G06Q 50/06
See application file for complete search history.

(56) References Cited

U.S. PATENT DOCUMENTS 6,606,251 B1 *   8/2003   Kenny, Jr. ............ G06F 1/26
                                              257/E23.067
7,617,315 B2 *   11/2009  Black .................... H04L 43/00
                                              370/338
(Continued)

FOREIGN PATENT DOCUMENTS

JP        3403368 B2      5/2003
JP        2004-056969 A   2/2004
(Continued)

OTHER PUBLICATIONS

International Search Report for PCT/JP2016/050494 dated Apr. 5, 2016 [PCT/ISA/210].
(Continued)

*Primary Examiner* — Elias Desta
(74) *Attorney, Agent, or Firm* — Sughrue Mion, PLLC

(57) ABSTRACT

As means for solving the above-described problem, there is provided a data processing device (1) including a measurement data acquisition unit (10) that acquires measurement data indicating a temporal change in at least one of current consumption and power consumption of an electrical apparatus, a reference component extraction unit (20) that extracts a reference component of the current consumption and a reference component of the power consumption from the measurement data, and a feature value acquisition unit (30) that acquires a feature value of each reference component.

12 Claims, 17 Drawing Sheets

(51) Int. Cl.
G06N 5/04 (2006.01)
G06Q 50/06 (2012.01)

(56) References Cited

U.S. PATENT DOCUMENTS

| | | | |
|---|---|---|---|
| 2013/0274943 A1* | 10/2013 | Nojima | G01D 4/00 700/295 |
| 2015/0058276 A1 | 2/2015 | Ito et al. | |
| 2016/0154038 A1* | 6/2016 | Toizumi | G01R 21/00 702/61 |

FOREIGN PATENT DOCUMENTS

| | | | |
|---|---|---|---|
| JP | 2009-257952 A | 11/2009 | |
| JP | 2011-130535 A | 6/2011 | |
| WO | 2015/008645 A1 | 1/2015 | |

OTHER PUBLICATIONS

Written Opinion for PCT/JP2016/050494 dated Apr. 5, 2016 [PCT/ISA/237].
Communication dated Aug. 13, 2019 from Japanese Patent Office in counterpart JP Application No. 2017-509311.

* cited by examiner

FIG. 8

| TIME | POWER CONSUMPTION | OPERATIONAL STATUS GROUP | FLUCTUATION STATUS GROUP |
|---|---|---|---|
| 8:00:00 | .... | 0 | |
| 8:00:15 | .... | 0 | |
| 8:00:30 | .... | 0 | |
| ⋮ | ⋮ | ⋮ | ⋮ |
| 8:30:00 | .... | 2 | ✔ |
| 8:30:15 | .... | 2 | ✔ |
| ⋮ | ⋮ | ⋮ | ⋮ |

FIG. 11

| FEATURE VALUE | OPERATIONAL STATUS |
|---|---|
| ⋮ | ⋮ |

FIG. 15

| REFERENCE COMPONENT FEATURE VALUE | FLUCTUATION COMPONENT FEATURE VALUE | OPERATIONAL STATUS |
|---|---|---|
| ⋮ | ⋮ | ⋮ | ent
DATA PROCESSING DEVICE, DATA PROCESSING METHOD, AND NON-TRANSITORY STORAGE MEDIUM

CROSS REFERENCE TO RELATED APPLICATIONS

This application is a National Stage of International Application No. PCT/JP2016/050494 filed Jan. 8, 2016, claiming priority based on Japanese Patent Application No. 2015-071070 filed Mar. 31, 2015, the contents of all of which are incorporated herein by reference in their entirety.

TECHNICAL FIELD

The present invention relates to a data processing device, a data processing method, and a program.

BACKGROUND ART

Operational statuses (turn-on/turn-off, power consumption, and the like) of individual electrical apparatuses can be easily recognized by mounting a measuring device to a power supply of each apparatus. However, there is a problem in that a burden is imposed on a user due to labor and time required for the installation thereof or a problem in that the cost of the measuring device is required.

A method disclosed in Patent Document 1 is provided as a means for solving such a problem. In this method, an operational status of an individual electrical apparatus is inferred using voltage and current information measured in the vicinity of a power feed inlet. According to this method, it is possible to reduce a burden on a user and the cost, as compared to a method of mounting a power measuring device on every apparatus.

In addition, Patent Document 2 discloses an apparatus inference device connected to a plurality of electrical apparatuses for inferring the types of electrical apparatuses and the like from power demand measurement results. The apparatus inference device includes: a power demand fluctuation analysis unit that extracts a time fluctuation waveform having power demands of the plurality of electrical apparatuses being superimposed on each other therein and the magnitude of the amount of power demand fluctuation from the measurement results and extracts a plurality of time fluctuation waveforms constituted by only the magnitude of the amount of power demand fluctuation for each magnitude of the amount of power demand fluctuation; a period distribution analysis unit that extracts a representative period from period distribution of the time fluctuation waveforms; a database that stores features unique to intermittent operation of the plurality of electrical apparatuses; and an inference unit that infers an electrical apparatus in intermittent operation by comparing the extracted magnitude of the amount of power demand fluctuation and the representative period with the stored features unique to the intermittent operation of the electrical apparatuses.

RELATED DOCUMENT

Patent Document

[Patent Document 1] Japanese Patent No. 3403368
[Patent Document 2] Japanese Laid-open Patent Publication No. 2009-257952

SUMMARY OF THE INVENTION

Technical Problem

An electrical apparatus may fluctuate in current consumption and power consumption during its operation in a predetermined range or more within a short period of time. For example, a notebook PC having an inverter, and the like correspond to such an apparatus. In the notebook PC, the current consumption and the power consumption fluctuate in a predetermined range or more within a short period of time in accordance with, for example, the usage rate of a CPU, and the like.

For such a fluctuation, the techniques disclosed in Patent Documents 1 and 2 need to prepare teacher data of a plurality of current waveforms having different shapes or amplitudes. Thus, there may be a problem in that the accuracy of inference becomes deteriorated unless the processing or the like of measurement data measured in the vicinity of a power feed inlet is performed after the teacher data is prepared so as to sufficiently cover the fluctuation.

An object of the invention is to provide a new technique for inferring an operational status of an electrical apparatus.

Solution to Problem

According to the invention, there is provided a data processing device including: a measurement data acquisition unit that acquires measurement data indicating a temporal change in at least one of current consumption and power consumption of an electrical apparatus; a reference component extraction unit that extracts a reference component of the current consumption and a reference component of the power consumption from the measurement data; and a feature value acquisition unit that acquires a feature value of each reference component.

In addition, according to the invention, there is provided a data processing device including: a feature value storage unit that stores a feature value of a reference component of current consumption and a feature value of a reference component of power consumption of an electrical apparatus as teacher data; and an inference unit that infers an operational status of the electrical apparatus on the basis of the teacher data.

In addition, according to the invention, there is provided a data processing method executed by a computer, the method including: a measurement data acquisition step of acquiring measurement data indicating a temporal change in at least one of current consumption and power consumption of an electrical apparatus; a reference component extraction step of extracting a reference component of the current consumption and a reference component of the power consumption from the measurement data; and a feature value acquisition step of acquiring a feature value of each reference component.

In addition, according to the invention, there is provided a data processing method, executed by a computer, the computer storing a feature value of a reference component of current consumption and a feature value of a reference component of power consumption of an electrical apparatus as teacher data, the method including: an inference step of inferring an operational status of the electrical apparatus on the basis of the teacher data.

In addition, according to the invention, there is provided a program causing a computer to function as: a measurement data acquisition unit that acquires measurement data indicating a temporal change in at least one of current consumption and power consumption of an electrical apparatus; a reference component extraction unit that extracts a reference component of the current consumption and a reference component of the power consumption from the measurement data; and a feature value acquisition unit that acquires a feature value of each reference component.

In addition, according to the invention, there is provided a program causing a computer to function as: a feature value storage unit that stores a feature value of a reference component of current consumption and a feature value of a reference component of power consumption of an electrical apparatus as teacher data; and an inference unit that infers an operational status of the electrical apparatus on the basis of the teacher data.

Advantageous Effects of Invention

According to the invention, a new technique for inferring an operational status of an electrical apparatus is achieved.

BRIEF DESCRIPTION OF THE DRAWINGS

The above-described objects, other objects, features and advantages will be further apparent from the preferred exemplary embodiments described below, and the accompanying drawings as follows.

FIG. 8 is a schematic diagram illustrating an example of information summarizing results of grouped measurement data.

FIG. 11 is a schematic diagram illustrating an example of teacher data according to the exemplary embodiment.

FIG. 15 is a schematic diagram illustrating an example of teacher data according to the exemplary embodiment.

DESCRIPTION OF EXEMPLARY EMBODIMENTS

First, an example of a hardware configuration of a device according to the exemplary embodiment will be described. Units included in the device according to the exemplary embodiment are implemented by any combination of hardware and software on the basis of a central processing unit (CPU), a memory, a program loaded into the memory, a storage unit (can also store not only a program which has been stored in advance from the stage of shipping out the device but also a program which is downloaded from a storage medium such as a compact disc (CD), or a server or the like on the Internet) such as a hard disk which stores the program, and an interface for network connection of an arbitrary computer. In addition, those skilled in the art can understand that various modification examples can be made to the implementation method and the device.

Figure 1:
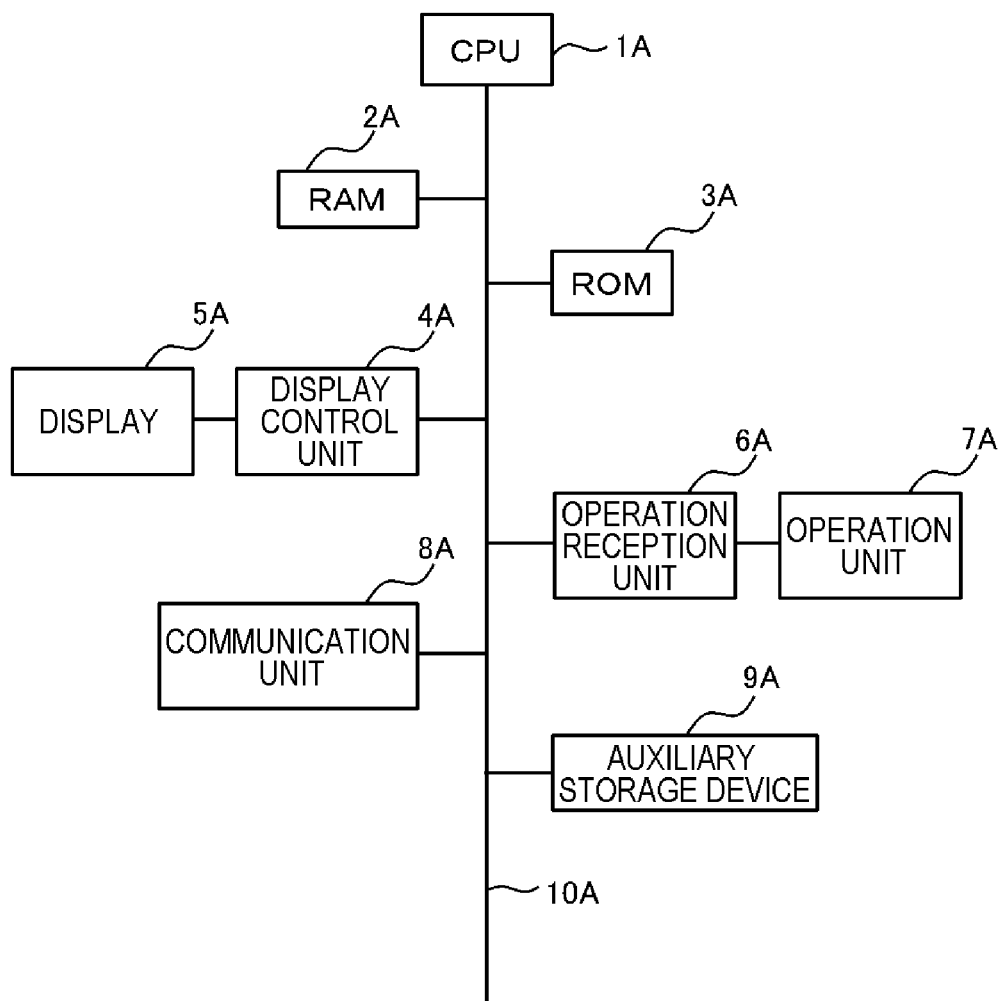
FIG. 1 is a conceptual diagram illustrating an example of a hardware configuration of a device according to the exemplary embodiment.

FIG. 1 is a conceptual diagram illustrating an example of a hardware configuration of the device according to the exemplary embodiment. As illustrated in FIG. 1, the device according to the exemplary embodiment includes, for example, a CPU 1A, a random access memory (RAM) 2A, a read only memory (ROM) 3A, a display control unit 4A, a display 5A, an operation reception unit 6A, an operation unit 7A, a communication unit 8A, an auxiliary storage device 9A, and the like connected to each other by a bus 10A. Note that, although not shown in the drawing, the device may further include other components such as an input and output interface, a microphone, and a speaker connected to an external apparatus in a wired manner.

The CPU 1A controls the overall computer of the device together with the components. The ROM 3A includes an area for storing programs and various application programs for operating the computer, various pieces of setting data used during operation of the programs, and the like. The RAM 2A includes an area, such as a work area for the operation of the programs, for temporarily storing data. The auxiliary storage device 9A is, for example, a hard disc drive (HDD), capable of storing large-capacity data.

The display 5A is, for example, a display device (a light emitting diode (LED) screen, a liquid crystal display, an organic electro luminescence (EL) display, or the like). The display 5A may be a touch panel display integrated with a touch pad. The display control unit 4A reads data stored in a video RAM (VRAM), performs predetermined process on the read data, and transmits the processed data to the display 5A to display various screens. The operation reception unit 6A receives various operations through the operation unit 7A. The operation unit 7A includes an operation key, an operation button, a switch, a jog dial, a touch panel display, a keyboard, and the like. The communication unit 8A is connected to a network, such as the Internet or a local area network (LAN), in a wired and/or wireless manner to communicate with other electronic apparatuses.

Hereinafter, the exemplary embodiments will be described. Note that, functional block diagrams used in describing the following exemplary embodiment show function-based blocks rather than hardware-based configurations. In the functional block diagrams, although a description is given such that each device is implemented by one apparatus, the implementation means therefor is not limited thereto. In other words, each device may be configured to be physically or logically separated. Note that the same components will be denoted by the same reference numerals and signs, and a description thereof will not be repeated.

First Exemplary Embodiment

First, an outline of the first exemplary embodiment will be described. Among electrical apparatuses, there is an electrical apparatus that may fluctuate in the current consumption and the power consumption in equal to or more than a predetermined range within a short period of time during the operation thereof. For example, an electrical apparatus including an inverter (for example, a notebook PC or the like) corresponds to such an apparatus. Note that there is also an electrical apparatus in which such a fluctuation has not occurred (for example, an illumination device not including an inverter, and the like).

When a data processing device 1 according to the present exemplary embodiment acquires measurement data indicating a temporal change in at least one of current consumption and power consumption that are measured during the operation of one or a plurality of electrical apparatuses, the data processing device extracts a reference component that does not include a component related to the fluctuation (fluctuation component). The data processing device 1 acquires a feature value from the extracted reference component. Hereinafter, a description thereof will be given in detail.

Figure 2:
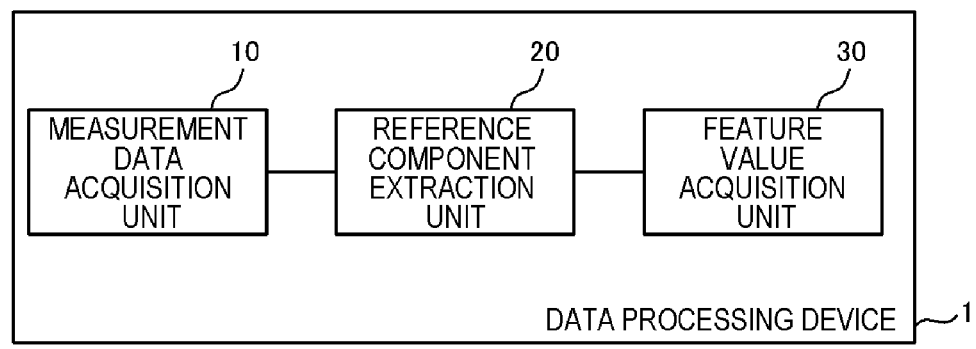
FIG. 2 illustrates an example of a functional block diagram of a data processing device according to the exemplary embodiment.

A configuration of the data processing device 1 according to this exemplary embodiment will be described in detail. FIG. 2 illustrates an example of a functional block diagram of the data processing device 1 according to this exemplary embodiment. As illustrated in FIG. 2, the data processing device 1 includes a measurement data acquisition unit 10, a reference component extraction unit 20, and a feature value acquisition unit 30.

The measurement data acquisition unit 10 acquires measurement data indicating temporal changes in at least one of current consumption and power consumption of an electrical apparatus. The measurement data may include only components of one electrical apparatus, or may include components of a plurality of electrical apparatuses. In the latter case, the components of the plurality of electrical apparatuses may simultaneously appear.

For example, a measurement device may be provided in the vicinity of equipment such as a main power supply, a power feed (power supply) inlet, a distribution board, or an electrical outlet provided in a facility of each power consumer (for example, home, office, store, and the like). The measurement data acquisition unit 10 may acquire, for each power consumer, measurement data measured by the measurement device in the consumer's daily life. In this manner, measurement data acquired corresponding to each power consumer includes components of an electrical apparatus (current consumption and power consumption) used by the power consumer in the power consumer's facility. In addition, measurement data indicating usage patterns of the plurality of electrical apparatuses used by the respective power consumers is obtained. The usage patterns of the plurality of electrical apparatuses refer to combination patterns of the electrical apparatuses such as "a case of independently using electrical apparatus A" and "a case of simultaneously using electrical apparatus A and electrical apparatus B".

The data processing device 1 may be provided inside a facility of each power consumer. The measurement data acquisition unit 10 may acquire measurement data from the measurement device by using any communication unit based on a wired and/or wireless method. In addition, the data processing device 1 may be provided on a network such as the Internet (for example, a cloud server). In this case, the facility of each power consumer includes a transmission device that transmits the measurement data measured by the measurement device to the data processing device 1. The measurement data acquisition unit 10 receives the measurement data transmitted by the transmission device.

Figure 3:
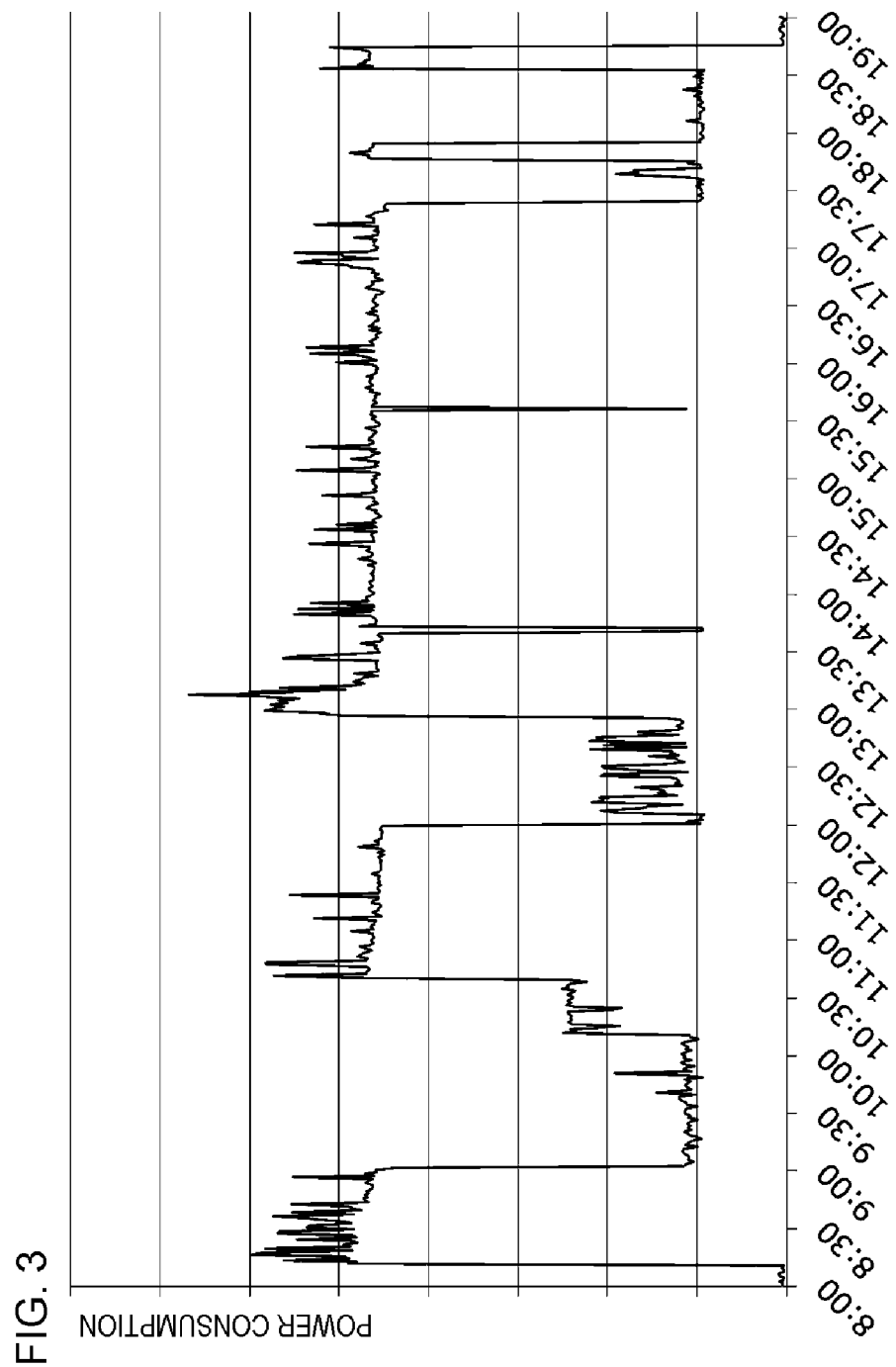
FIG. 3 is a diagram illustrating an example of measurement data according to the exemplary embodiment.

FIG. 3 illustrates an example of measurement data acquired by the measurement data acquisition unit 10. FIG. 3 illustrates measurement data indicating temporal changes in power consumption between 8:00 and 19:00 on a certain day.

Referring back to FIG. 2, the reference component extraction unit 20 extracts a reference component that does not include a fluctuation component related to fluctuation in current consumption and power consumption from the measurement data acquired by the measurement data acquisition unit 10. The wording "fluctuation" in the present exemplary embodiment refers to fluctuation in current consumption and power consumption in equal to or more than a predetermined range (for example, a difference between a maximum value and a minimum value within a period of time is equal to or greater than 50 mA and equal to or greater than 5 W) within a short period of time (for example, several seconds or several minutes). The fluctuation in equal to or more than a predetermined range may appear regularly or irregularly. A minute fluctuation due to a measurement error or a change in the surrounding environment is not included in the "fluctuation" in the present exemplary embodiment. Hereinafter, the above-mentioned fluctuation according to the present exemplary embodiment may be referred to as "the fluctuation". The "predetermined range" in the definition of the fluctuation may be a constant multiple of $\Delta P$ to be described below with reference to FIG. 6.

Among electrical apparatuses, there is an electrical apparatus that may fluctuate in the current consumption and the power consumption in equal to or more than a predetermined range within a short period of time during the operation thereof. For example, an electrical apparatus such as a notebook PC including an inverter corresponds thereto. The fluctuation is also caused by, for example, an inverter or the like. For example, in a case of a notebook PC including an inverter, the fluctuation occurs depending on a fluctuation in the usage rate of a CPU. On the other hand, in a case where the usage rate of the CPU is constant, no fluctuation occurs. The wording "may fluctuate" means that a fluctuation may occur due to the design of the electrical apparatus, but does not necessarily always occur. The fluctuation occurs intermittently. That is, a fluctuating time slot and a non-fluctuating time slot are present together during the operation of the electrical apparatus.

Note that, among electrical apparatuses, there is also an electrical apparatus in which no fluctuation occurs. For example, an illumination device that does not include an inverter, and the like correspond thereto.

Current consumption and power consumption fluctuate during the occurrence of the fluctuation. That is, the current consumption and the power consumption have various values during the occurrence of the fluctuation. On the other hand, the current consumption and the power consumption do not fluctuate while the fluctuation is not occurring. That is, the current consumption and the power consumption have a substantially constant value while the fluctuation is not occurring.

Thus, in measurement data of current consumption and power consumption, the frequency of appearance (frequency of appearance) of each value when the fluctuation is not occurring is higher than the frequency of appearance (frequency of appearance) of each value when the fluctuation is occurring. The reference component extraction unit 20 extracts a reference component from the measurement data by using such a feature.

Figure 4:
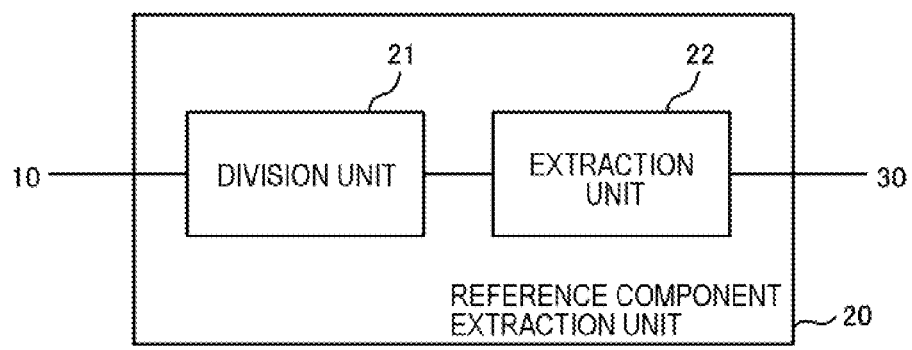
FIG. 4 illustrates an example of a functional block diagram of a reference component extraction unit according to the exemplary embodiment.

FIG. 4 illustrates an example of a functional block diagram of the reference component extraction unit 20. As illustrated in the drawing, the reference component extraction unit 20 includes a division unit and an extraction unit 22.

The division unit 21 divides the measurement data into a fluctuation-occurring group and a non-fluctuation-occurring group on the basis the frequency of appearance of the values. The division unit 21 classifies values having a relatively high frequency of appearance as the non-fluctuation-occurring group.

For example, the division unit 21 may classify values having a relatively high frequency of appearance and values in the vicinity thereof in the non-fluctuation-occurring group. The division unit 21 may classify the other values in the fluctuation-occurring group.

Figure 5:
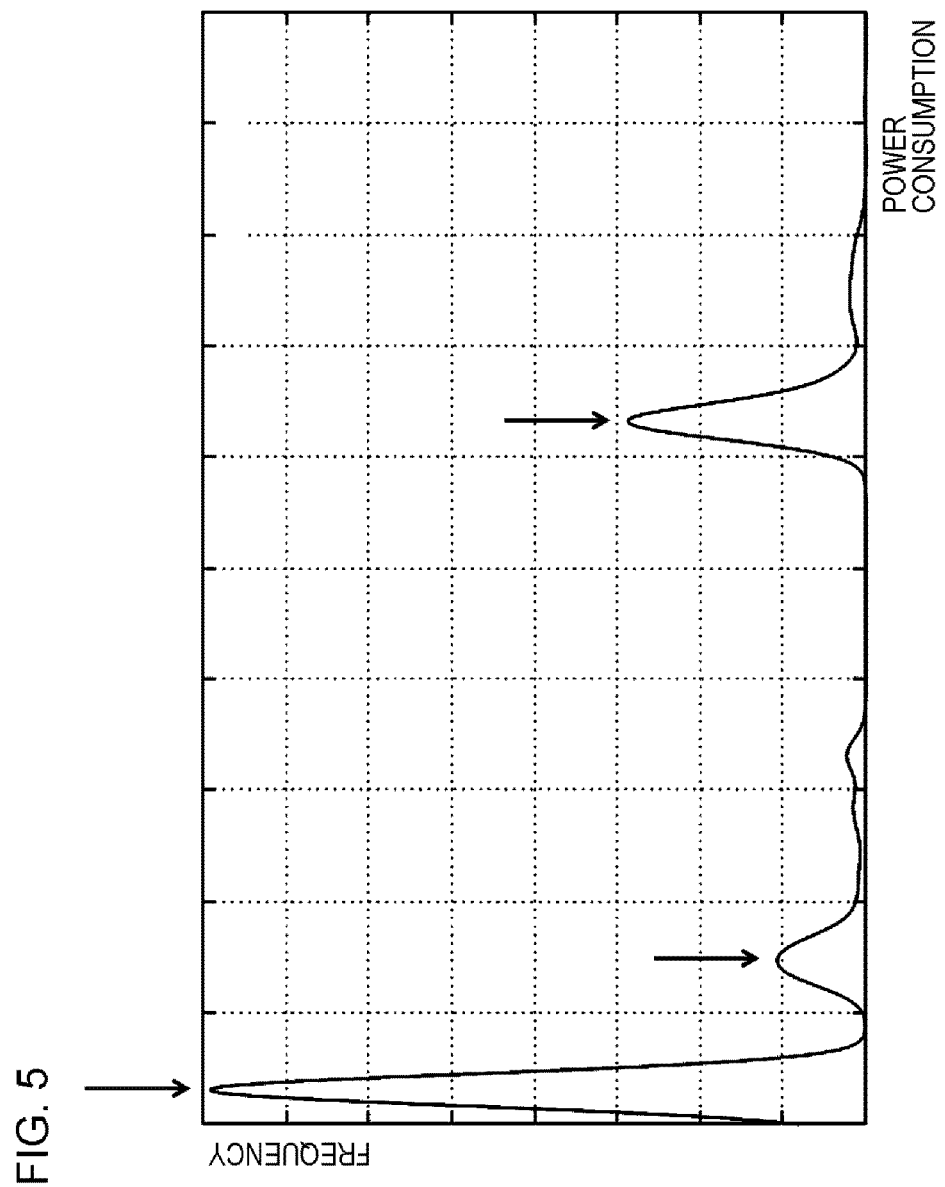
FIG. 5 is a diagram illustrating an example of frequency data according to the exemplary embodiment.

Here, an example of processing performed by the division unit 21 will be described. First, the division unit 21 obtains frequency data as illustrated in FIG. 5 from the measurement data as illustrated in FIG. 3. FIG. 5 illustrates density distribution obtained by applying Gaussian kernel density estimation to the power consumption data of FIG. 3. Here, the horizontal axis represents power, and the vertical axis represents frequency. Note that, in the example, the density distribution of power consumption is shown in order to facilitate a description, but frequency data of other types of values may be obtained. The other types of values may be, for example, a current, a reference waveform obtained by performing frequency decomposition of a current waveform, the intensity and phase of a harmonic of the current waveform, a power factor, a maximum value of the current waveform, and the like. Further, these values may be obtained by the four arithmetic operations.

Note that it is possible to obtain time-series data that does not include a fluctuation component or time-series data that includes a small number of fluctuation components depending on a method of selecting a data type. When the above-described frequency data is generated on the basis of the time-series data, it is possible to extract a reference component with a high level of accuracy.

For example, in data including only one electrical apparatus causing the generation of a fluctuation component (electrical apparatus causing the fluctuation), a fluctuation component vector is in one direction. When a component (data type) which is perpendicular to the direction of the fluctuation component vector is selected, it is possible to extract time-series data constituted by only a reference component. Even when the data includes plural electrical apparatuses that may cause fluctuation components (electrical apparatuses in which the fluctuation may occur), if the fluctuation component vectors are in one direction, only the reference components may be extracted) in the same manner as mentioned above.

In a case where a plurality of electrical apparatuses causing the generation of fluctuation components (electrical apparatuses in which fluctuation occurs) are included and there are a plurality of fluctuation component vectors, a direction of the sum of the plurality of fluctuation component vectors is set to be the one fluctuation component vector. By obtaining a component (data type) perpendicular to the one fluctuation component vector, it is possible to obtain time-series data including a small number of fluctuation components.

After the frequency data as illustrated in FIG. 5 is obtained, the division unit 21 extracts a peak satisfying a predetermined condition from a plurality of peaks appearing in the frequency data. Thereby, a noise component (noise peak) is removed. Note that, the "peak" in the present exemplary embodiment indicates the highest point of a curve, that is, a maximal value. In the present exemplary embodiment, the front and back slopes of a curve constituted by data located before and after the peak is referred to as a "curve including a peak".

There are various methods of extracting a peak satisfying the predetermined condition, that is, methods of removing a noise component, and a peak may be extracted with which, for example, a half value width $\Delta P_k$ (P denotes power consumption, and k denotes a peak number) can be calculated. That is, a peak with which the half value width $\Delta P_k$ cannot be calculated may be removed as a noise component. For example, a peak range may be determined for each peak, and a peak may be extracted with which the half value width $\Delta P_k$ can be calculated (determined) within the peak range. The peak range may be determined on the basis of, for example, a peak value (power consumption). For example, the peak range may be equal to or greater than (peak value $P_k - \alpha_1$) and equal to or less than (peak value $P_k + \alpha_2$).

As another example of a method of extracting a peak satisfying a predetermined condition, a peak having a value (frequency) equal to or greater than a predetermined value may be extracted. In addition, a peak may be extracted in which the width between the slopes of the curve including the peak is equal to or less than a predetermined value at a predetermined height (for example, the width between the slopes of the curve at a height of 80% of the height (value (frequency) of the peak) of the peak is equal to or less than the predetermined value). In addition, a predetermined number of peaks may be sequentially extracted in descending order of the value (frequency).

Note that, a combination of "equal to or greater", "equal to or less", and "less" used in showing a predetermined range is a matter of design, and can be changed to any combination of the above-mentioned ranges. The same premise applies hereinafter.

In a case of the measurement data illustrated in FIG. 3, three peaks indicated by arrows in FIG. 5 are extracted through the above-described processing. The peaks extracted here prominently show features (power consumption in a case of the example of FIG. 5) when the fluctuation is not occurring. Note that the features of the extracted plurality of peaks respectively show operational statuses of different electrical apparatuses. For example, there is a difference among the peaks such as "different operating electrical apparatuses" or "same operating electrical apparatuses but different operational contents (contents of processing being performed) for at least one electrical apparatus".

Thereafter, the division unit 21 divides the measurement data into groups for each extracted peak. As described above, the plurality of peaks correspond to operational statuses of different electrical apparatuses. Here, the wording "division into groups" refers to division of the measurement data according to each operational status of the electrical apparatus. In a case where only one peak is extracted, the division into groups mentioned here is not necessary. By dividing the data into groups according to each operational status, it is possible to clarify to which operational content each fluctuation component corresponds.

Here, an example of division into groups based on each operational status will be described. For example, division into groups may be performed by defining a range of equal to or greater than (peak value $P_k-\beta_1$) to less than (peak value $P_{k+1}-\beta_2$) as a group corresponding to the peak value $P_k$. In addition, division into groups may be performed by defining a range of equal to or greater than (peak value $P_k-\beta_3$) to less than (peak value $P_k+\beta_4$) as a group corresponding to the peak value $P_k$.

In the former example, when $\beta_1$ is defined as a half value width $\Delta P_k$ and $\beta_2$ is defined as a half value width $\Delta P_{k+1}$, the following expression is true.

$$(P_k-\Delta P_k) \leq P < (P_{k+1}-\Delta P_{k+1}) \qquad (1)$$

Figure 6:
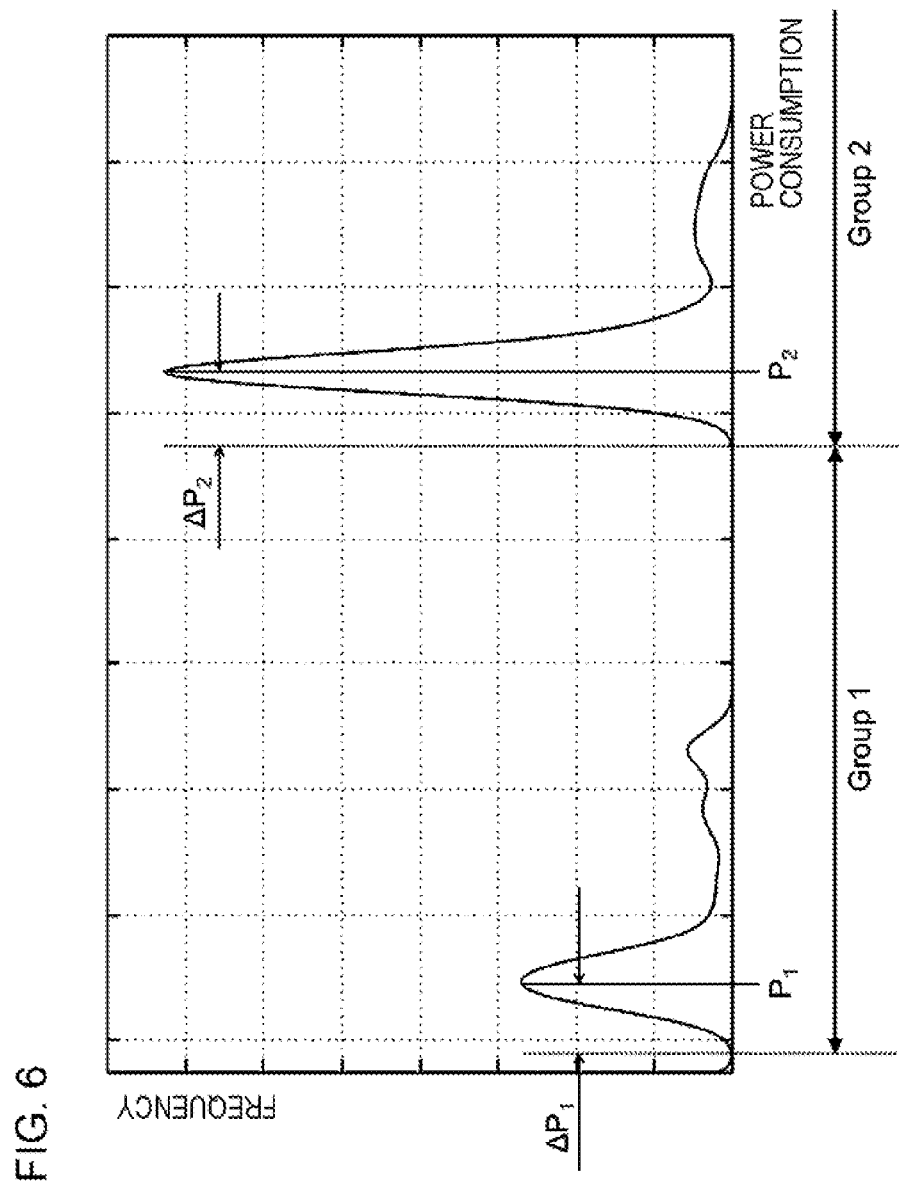
FIG. 6 is a diagram illustrating an example of a process of performing division into operational status groups on the basis of frequency data.
Figure 7:
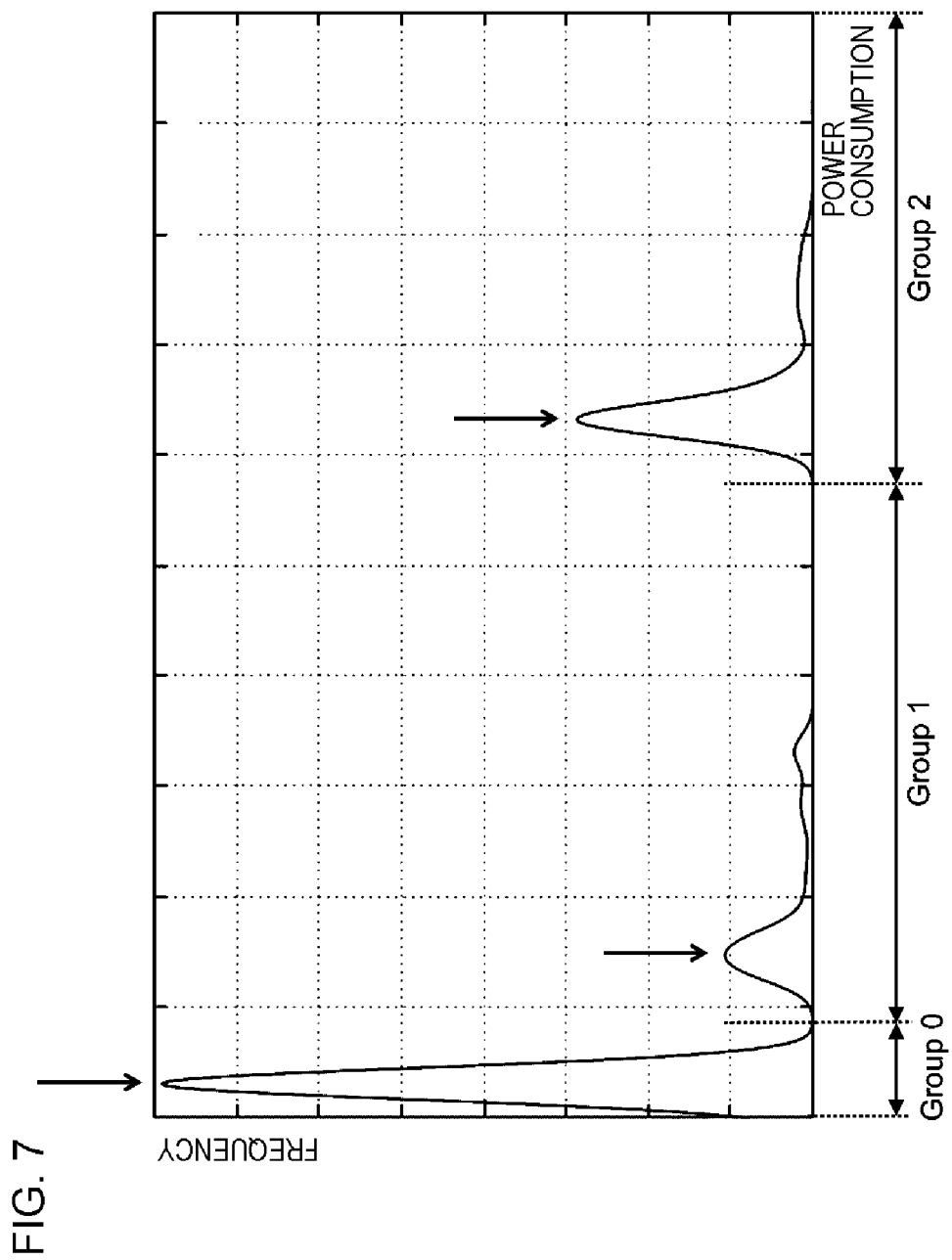
FIG. 7 is a diagram illustrating an example of a process of performing division into operational status groups on the basis of frequency data.

A concept of grouping based on the expression is illustrated in FIG. 6. In FIG. 6, the two peaks on the right extracted from FIG. 5 are illustrated in an enlarged manner, and ranges of group 1 and group 2 corresponding to the respective peaks are illustrated. As seen from FIG. 6, group 1 ranges from equal to or greater than (peak value $P_1-\Delta P_1$) to less than (peak value $P_2-\Delta P_2$). When the measurement data of FIG. 3 is grouped in accordance with the rule, the data is divided into group 0, group 1, and group 2 as illustrated in FIG. 7.

A portion of data illustrated in FIG. 8 is completed by the division into groups. In the data of FIG. 8, measured value (in FIG. 8, power consumption), results of division into groups based on operational statuses (in, operational status groups), and results of division into groups based on presence or absence of the fluctuation (in FIG. 8, fluctuation condition groups) are associated with information for identifying each piece of measurement data (in FIG. 8, measurement times). In a case of the example, the measurement data is obtained every 15 seconds, but is not limited thereto.

Results of the division into groups are described in the column of the operational status group. In the example illustrated in FIG. 8, each piece of measurement data is associated with any one of groups 0 to 2. Note that the column of the fluctuation condition groups is entered after the following processing is performed. Hereinafter, a group (in a case of the example of FIG. 7, groups 0 to 2) corresponding to an operational status will be referred to as an operational status group.

After the division into groups is performed, the division unit 21 divides measurement data of each operational status group into a fluctuation-occurring group in which the fluctuation has occurred and a non-fluctuation-occurring group in which the fluctuation has not occurred.

The division unit 21 sets measurement data included in a range from equal to or greater than (peak value $P_k-\gamma_1$) to equal to or less than (peak value $P_k+\gamma_2$) in the non-fluctuation-occurring group, and sets the other pieces of measurement data in the fluctuation-occurring group. For example, the value of $\Delta P_k$ may be used as the values of $\gamma_1$ and $\gamma_2$. Thereby, the column of the fluctuation status groups illustrated in FIG. 8 is filled. In FIG. 8, a flag (in FIG. 8, a check mark) is set for data belonging to the fluctuation-occurring group.

Thus, the division unit 21 can group measurement data for each operational status of the electrical apparatus. The division unit 21 can divide the measurement data of each operational status group into a fluctuation-occurring group and a non-fluctuation-occurring group.

Note that, in the above description, Gaussian kernel density estimation and the use of conditions using the half value width $\Delta P_k$ are described as a method of extracting a peak from measurement data, but any of other methods may be used as long as the method is for extracting a portion having high data density.

In addition, the division unit 21 can perform the division processing by using measurement data having any length as an object to be processed. For example, the division unit 21 may use the entire measurement data acquired from the measurement data acquisition unit 10 as an object to be processed, may use a portion of time-series data in a certain time range which is cut out from the entire time-series data acquired as an object to be processed, or may perform scanning of the entire time-series data (sequentially set the time-series data to be an object to be processed) while shifting a time range little by little, like a moving average.

Referring back to FIG. 4, the extraction unit 22 extracts components of measurement data of the non-fluctuation-occurring group as reference components for each operational status group (in a case of the example of FIG. 7, groups 0 to 2). For example, the reference component extraction unit 20 can determine measurement data belonging to the non-fluctuation-occurring group for each operational status group, on the basis of the data illustrated in FIG. 8. The reference components to be extracted may be a current waveform, a reference waveform obtained by performing frequency decomposition of the current waveform, a waveform of a harmonic of the current waveform, a power waveform, a reference waveform of the power waveform, and a waveform of a harmonic of the power waveform, temporal changes in a power factor, and the like. Further, these values may be values obtained by the four arithmetic operations.

Note that, among a plurality of pieces of measurement data included in the non-fluctuation-occurring group, small variations may be present caused by a measurement error and the like. The reference component extraction unit 20 may extract a plurality of reference components (for example, current waveforms) from the plurality of pieces of measurement data and then average the reference components in order to obtain one reference component. The reference component extraction unit 20 may set the obtained reference component (for example, current waveform) to be the reference component of the operational status.

Referring back to FIG. 2, the feature value acquisition unit 30 acquires a feature value of the reference component extracted by the reference component extraction unit 20 for each operational status group. For example, the feature value acquisition unit 30 may acquire the above-mentioned reference component itself as the feature value. In addition, the feature value acquisition unit 30 may acquire predetermined feature values (for example, features of the shape of a waveform, a phase difference between a reference wave and a harmonic, a difference in current values, a difference in power, and the like) from the above-mentioned reference component.

Thus, the feature values of the reference component included in the measurement data acquired by the measurement data acquisition unit 10 can be acquired for each operational status of the electrical apparatus.

Figure 9:
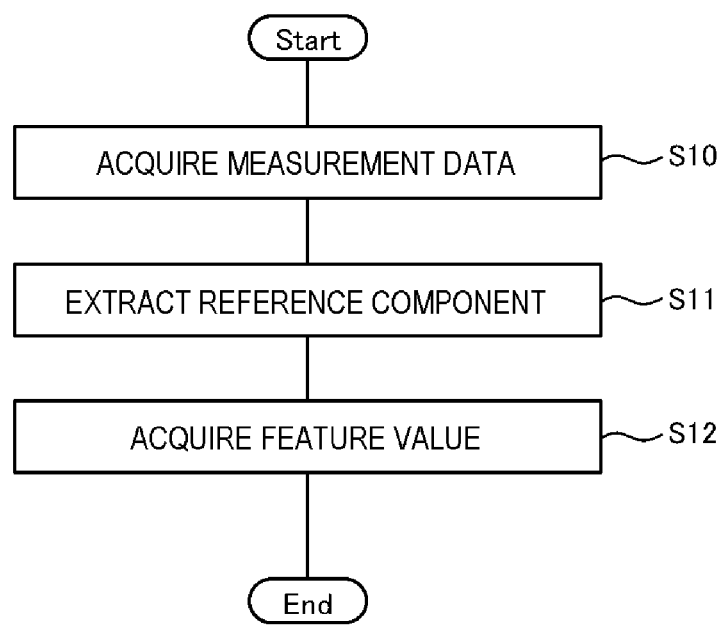
FIG. 9 is a flow chart illustrating an example of a processing flow of the data processing device according to the present exemplary embodiment.

Next, an example of a processing flow of the data processing device 1 according to the present exemplary embodiment will be described with reference to a flow chart of FIG. 9.

First, the measurement data acquisition unit 10 acquires measurement data indicating temporal changes in at least one of current consumption and power consumption of the electrical apparatus (S10). Next, the reference component extraction unit 20 extracts a reference component from the measurement data acquired in S10 (S11). Thereafter, the feature value acquisition unit 30 acquires a feature value of the reference component extracted in S11 (S12).

According to the present exemplary embodiment described above, it is possible to extract, from measurement data, a reference component of an electrical apparatus, that is, a component in a state where the fluctuation is not occurring. In addition, it is possible to acquire a feature value of the reference component. It is possible to extract feature values related to the reference component of the electrical apparatus from the measurement data by using the method according to the present exemplary embodiment and to accumulate the extracted feature values as teacher data. In addition, it is possible to extract feature values related to the reference component of the electrical apparatus from the measurement data by using the method according to the present exemplary embodiment and then to infer an operational status of the electrical apparatus on the basis of the feature values and the teacher data.

In the invention disclosed in Patent Document 1, an operational status of the electrical apparatus is inferred without considering whether or not the fluctuation is has occurred. That is, the accumulation of teacher data and the inference of an operational status of the electrical apparatus are performed by equally handling pieces of measurement data acquired in a state where the fluctuation has occurred and a state where the fluctuation has not occurred without distinguishing between the states. In a case of the means of Patent Document 1, the accuracy of inference of the operational status of the electrical apparatus deteriorates when the amount of teacher data is insufficient. For example, when a component in a fluctuating state is included in the measurement data during the inference process when a feature value in a non-fluctuating state is held as teacher data of an electrical apparatus A, consequently, it is not possible to accurately infer an operational status of the electrical apparatus A. Note that the same situation may occur also in a case where a feature value in a fluctuating state is held as teacher data of the electrical apparatus A and a fluctuation component is not included in the measurement data.

According to the data processing device 1 of the present exemplary embodiment which is capable of acquiring a feature value of a component (reference component) during a non-fluctuating state, it is possible to perform the accumulation of teacher data and the inference of an operational status of an electrical apparatus by distinguishing between a fluctuating state and a non-fluctuating state. As a result, it is possible to improve the accuracy of inference of an operational status of the electrical apparatus by using a small amount of teacher data, as compared to the means of Patent Document 1 described above.

Modification Example

In the above-described example, the division unit 21 divides measurement data into groups for respective operational statuses (operational status groups) on the basis of, for example, the above-described Expression (1), and then divides the measurement data of each operational status group into a fluctuation-occurring group and a non-fluctuation-occurring group. As a modification example, the process of performing division into groups for each operational status may not be performed.

For example, when there are a plurality of operational statuses such as the usage rate of a CPU in a predetermined electrical apparatus and a case where a plurality of pieces of electrical equipment are used, the fluctuation component is different for each operational status. That is, when operational contents (contents of processing being performed) obtained by division into groups are different from each other, fluctuation components in groups of the respective operational contents are also different from each other. Thus, by dividing the data into groups according to each operational status to extract a fluctuation component, it is possible to clarify to which operational content each fluctuation component for each group corresponds.

Second Exemplary Embodiment

A data processing device 1 according to the present exemplary embodiment is different from the first exemplary embodiment in that the data processing device has a function of registering a feature value acquired from a reference component as teacher data. The other configurations are the same as those in the first exemplary embodiment.

Figure 10:
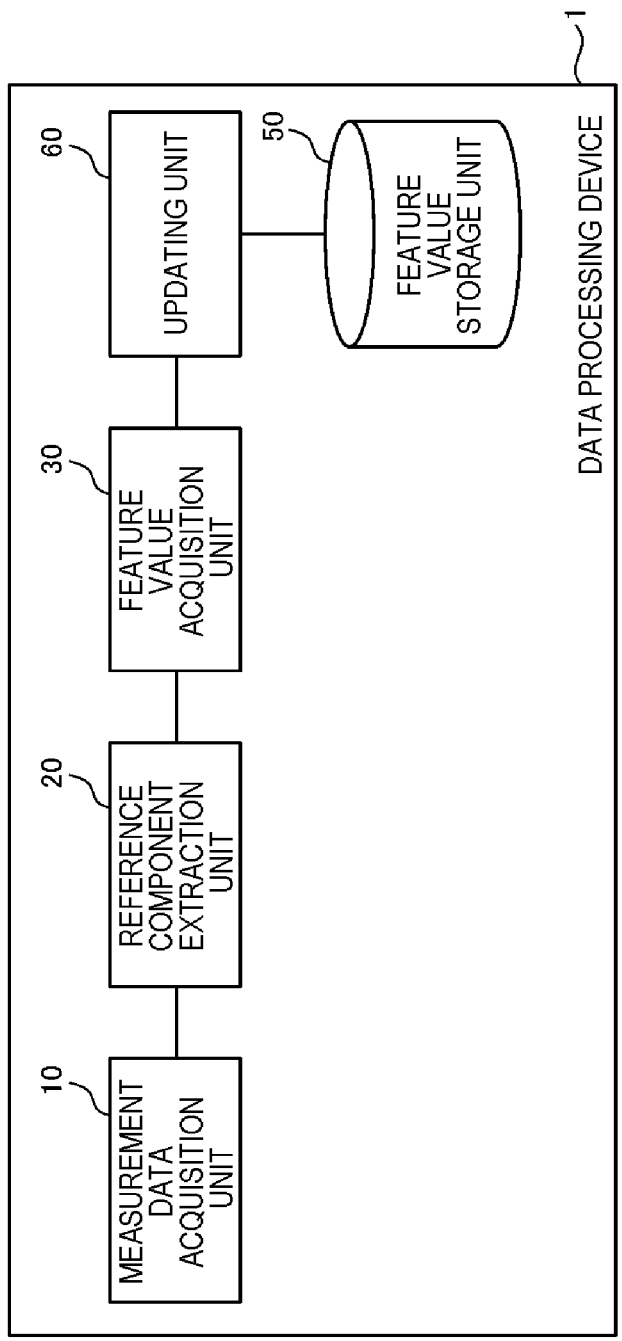
FIG. 10 illustrates an example of a functional block diagram of the data processing device according to the exemplary embodiment.

FIG. 10 illustrates an example of a functional block diagram of the data processing device 1 according to the present exemplary embodiment. As illustrated in FIG. 10, the data processing device 1 includes a measurement data acquisition unit 10, a reference component extraction unit 20, a feature value acquisition unit 30, a feature value storage unit 50, and an updating unit 60. Configurations of the measurement data acquisition unit 10, the reference component extraction unit 20, and the feature value acquisition unit 30 are the same as those in the first exemplary embodiment.

Figure 11:
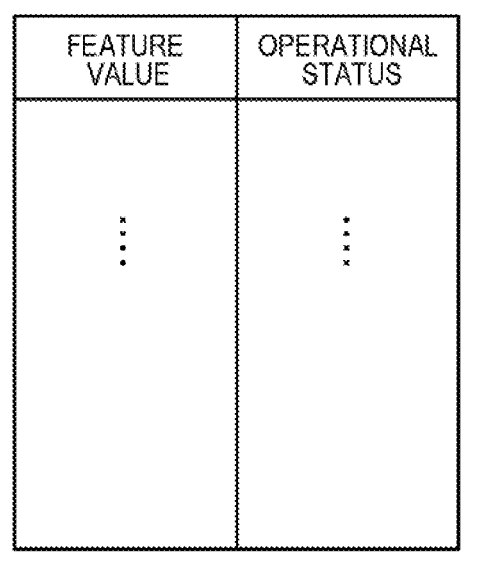

The feature value storage unit 50 stores a feature value of a reference component as teacher data. As illustrated in FIG. 11, the teacher data is configured of a pair of values constituted by a feature value (explanatory variable) of a reference component and an operational status (objective variable) of an electrical apparatus. The operational status of the electrical apparatus is contents for determining the electrical apparatus in operation such as "only electrical apparatus A in operation" or "electrical apparatuses A and B in operation".

When the feature value acquisition unit 30 acquires a feature value of a reference component, the updating unit 60 determines whether or not the feature value is already stored in the feature value storage unit 50. In a case where the feature value is not stored, the updating unit 60 newly registers the feature value in the feature value storage unit 50. For example, the updating unit 60 obtains differences between objects to be compared (differences between the feature values acquired by the feature value acquisition unit 30 and any feature value stored in the feature value storage unit 50), and may determine that the objects to be compared are the same as each other in a case where a value, such as the sum, the sum of absolute values, an effective value, or the sum of n-th powers (n is a real number) of the differences, is smaller than a predetermined threshold value.

Note that, in a case where the updating unit 60 registers a new feature value in the feature value storage unit 50, the updating unit may receive an input of contents of an operational status of an electrical apparatus corresponding to the feature value from a user at any timing. For example, the updating unit 60 may present to the user a time when a reference component of a feature value to be newly registered has appeared, and may receive an input for specifying an electrical apparatus that was in operation at that time. The updating unit 60 may register the input contents in association with the feature value newly registered.

Figure 12:
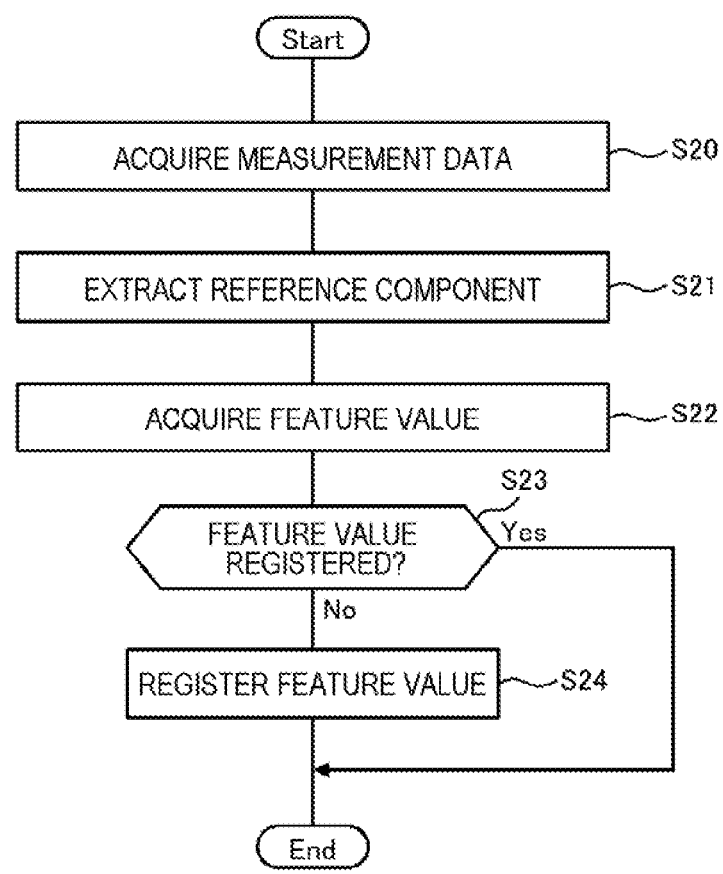
FIG. 12 is a flow chart illustrating an example of a processing flow of the data processing device according to the exemplary embodiment.

Next, an example of a processing flow of the data processing device 1 according to the present exemplary embodiment will be described with reference to a flow chart of FIG. 12.

First, the measurement data acquisition unit 10 acquires measurement data indicating a temporal change in at least one of current consumption and power consumption of an electrical apparatus (S20). Next, the reference component extraction unit 20 extracts a reference component from the measurement data acquired in S20 (S21). Thereafter, the feature value acquisition unit 30 acquires a feature value of the reference component extracted in S21 (S22).

Subsequently, the updating unit 60 checks whether or not the feature value of the reference component acquired in S22 has already been registered in the feature value storage unit 50. In a case where the feature value has not been registered (No in S23), the updating unit 60 newly registers the feature value of the reference component in the feature value storage unit 50 (S24). On the other hand, in a case where the feature value has been registered (Yes in S23), the updating unit 60 terminates the processing without newly registering the feature value of the reference component in the feature value storage unit 50. In addition, here, the feature value of the reference component may be used to update a registered feature value, for example, by obtaining an average by, and re-register the updated feature value in the feature value storage unit 50, thereafter terminating the processing. Further, when inference results are compared or the like and a result is determined to be further improved by newly extracted data, the registered data may be replaced with new data.

According to the present exemplary embodiment described above, it is possible to accumulate teacher data (a feature value of a reference component, and the like) for inferring an operational status of an electrical apparatus. In addition, as described in the first exemplary embodiment, in a case where the measurement data acquisition unit 10 acquires measurement data measured in the daily life of a power consumer, it is possible to accumulate a feature value of an electrical apparatus which is actually used by each power consumer in the power consumer's facility or a feature value corresponding to a usage pattern (for example, simultaneous use of electrical apparatus A and electrical apparatus B) of the electrical apparatus which is actually performed.

Third Exemplary Embodiment

A data processing device 100 according to the present exemplary embodiment has a function of inferring an operational status of an electrical apparatus by using the teacher data accumulated in the second exemplary embodiment.

Figure 13:
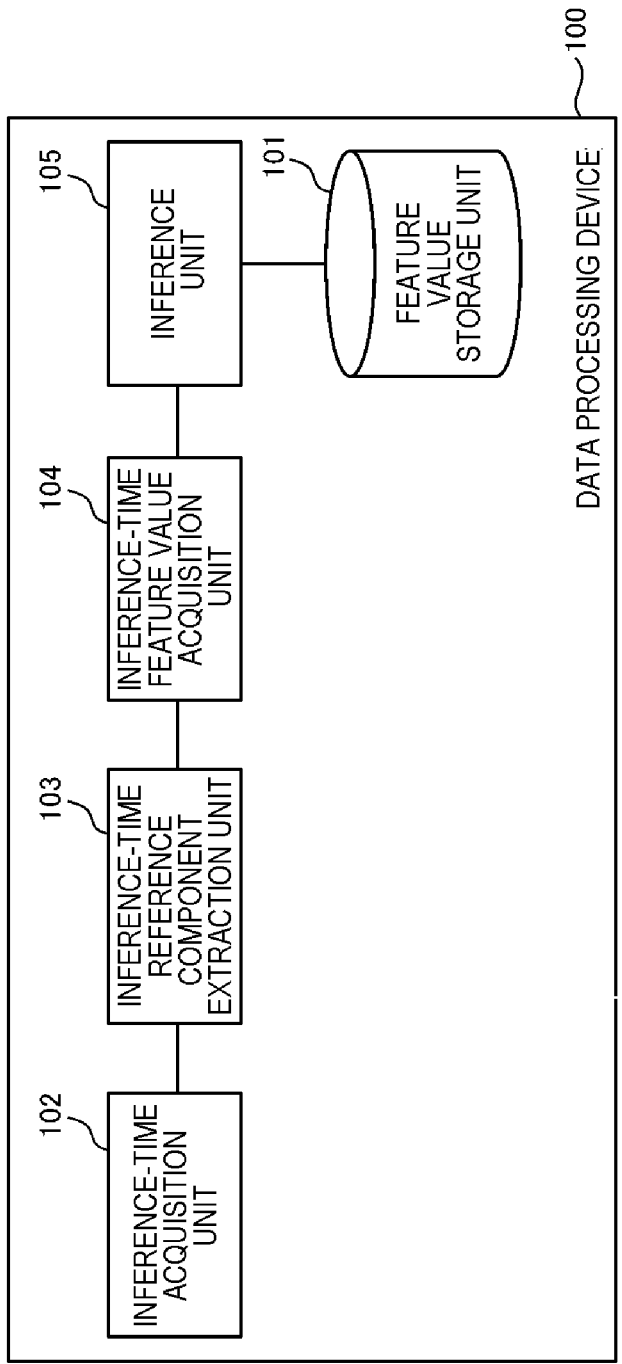
FIG. 13 illustrates an example of a functional block diagram of the data processing device according to the exemplary embodiment.

FIG. 13 illustrates an example of a functional block diagram of the data processing device 100 according to the present exemplary embodiment. As illustrated in FIG. 13, the data processing device 100 includes a feature value storage unit 101, an inference-time acquisition unit 102, an inference-time reference component extraction unit 103, an inference-time feature value acquisition unit 104, and an inference unit 105.

The feature value storage unit 101 stores a feature value of a reference component that does not include a component (fluctuation component) related to fluctuation (the fluctuation) in current consumption and power consumption as teacher data. The feature value storage unit 101 stores teacher data registered in the feature value storage unit 50 described in the second exemplary embodiment.

The inference-time acquisition unit 102 acquires measurement data indicating a temporal change in at least one of current consumption and power consumption. A configuration of the inference-time acquisition unit 102 is the same as the configurations of the measurement data acquisition units 10 described in the first and second exemplary embodiments.

The inference-time reference component extraction unit 103 extracts a reference component from the measurement data acquired by the inference-time acquisition unit 102. A configuration of the inference-time reference component extraction unit 103 is the same as the configurations of the reference component extraction units 20 described in the first and second exemplary embodiments. For example, the inference-time reference component extraction unit 103 sets pieces of measurement data between the present point in time and a predetermined period of time before the present point in time to be objects to be processed, and performs division into groups (operational status groups) according to the operational status of an electrical apparatus and division into groups according to the presence or absence of the occurrence of the fluctuation, by using the same method as in the first and second exemplary embodiments. As a result, data as illustrated in FIG. 8 is obtained. Thereafter, the inference-time reference component extraction unit 103 extracts a reference component of the operational status group to which the measurement data at the present point in time belongs.

The inference-time feature value acquisition unit 104 acquires a feature value of the reference component extracted by the inference-time reference component extraction unit 103. A configuration of the inference-time feature value acquisition unit 104 is the same as those of the feature value acquisition units 30 described in the first and second exemplary embodiments.

The inference unit 105 infers the operational status of the electrical apparatus on the basis of the teacher data stored in the feature value storage unit 101 and the feature value of the reference component acquired by the inference-time feature value acquisition unit 104. Specific means for inference performed by the inference unit 105 is not particularly limited, and any method can be adopted. For example, machine learning such as a neural network may be used.

Thereafter, the data processing device 100 may display an inference result obtained by the inference unit 105 through an output device such as a display. For example, information such as "electrical apparatus A and electrical apparatus B presently in operation" may be displayed. A user can easily recognize the electrical apparatus in operation with reference to the information. Effort toward power saving, such as stopping wasteful operation of an electrical apparatus, can be expected.

Figure 14:
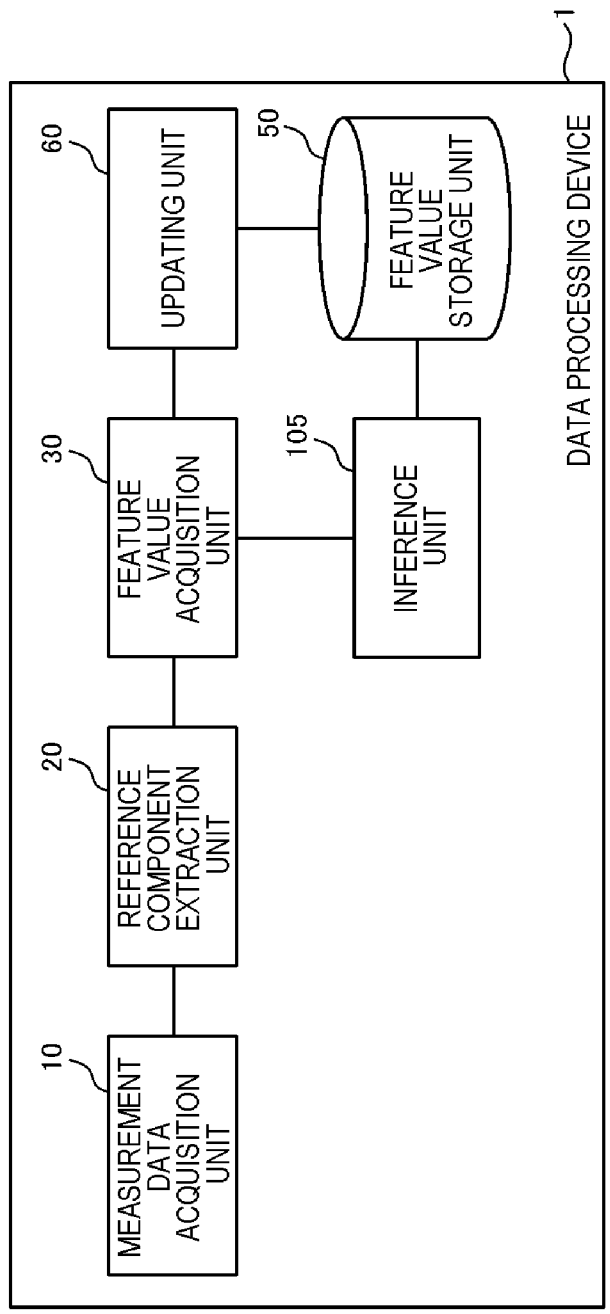
FIG. 14 illustrates an example of a functional block diagram of the data processing device according to the exemplary embodiment.

Note that a configuration as illustrated in FIG. 14 can also be adopted as a modification example of the present exemplary embodiment. Configurations of a measurement data acquisition unit 10, a reference component extraction unit 20, a feature value acquisition unit 30, a feature value storage unit 50, and an updating unit 60 are as described in the first and second exemplary embodiments. The inference unit 105 infers an operational status of an electrical apparatus on the basis of the feature value of the reference component acquired by the feature value acquisition unit 30 and the teacher data stored in the feature value storage unit 50. In a case of the modification example, measurement data acquired by the measurement data acquisition unit 10 can be used in both a process of accumulating teacher data and a process of inferring an operational status of an electrical apparatus.

According to the present exemplary embodiment described above, it is possible to infer an operational status of an electrical apparatus by using a feature value of a reference component. In the invention disclosed in Patent Document 1, an operational status of an electrical apparatus is inferred without making a distinction between fluctuation and non-fluctuation. Thus, when a feature value during non-fluctuation is held as teacher data of an electrical apparatus A, and a component of the fluctuation is included in the measurement data during an inference process, consequently, it is not possible to accurately infer the operational status of the electrical apparatus A. Note that the same situation may occur even when a feature value during the occurrence of the fluctuation is held as teacher data of the electrical apparatus A, due to unnecessary teacher data.

According to the present exemplary embodiment in which a reference component is extracted from measurement data, and an operational status of an electrical apparatus is inferred on the basis of a feature value of the fluctuation component of the reference component, it is possible to reduce the above-described disadvantage.

Fourth Exemplary Embodiment

A data processing device 100 according to the present exemplary embodiment is different from that in the third exemplary embodiment in that the data processing device can infer an operational status of an electrical apparatus by using a feature value of a fluctuation component as teacher data. The other configurations are the same as those in the third exemplary embodiment.

An example of a functional block diagram of the data processing device 100 according to the present exemplary embodiment is illustrated in FIG. 13, similarly to the third exemplary embodiment. A configuration of an inference-time acquisition unit 102 is the same as that in the third exemplary embodiment.

A feature value storage unit 101 stores a feature value of a reference component and a feature value of a fluctuation component as teacher data. FIG. 15 schematically illustrates an example of teacher data stored in the measurement data acquisition unit 10. In the teacher data of FIG. 15, a feature value (explanatory variable) of a reference component and a feature value (explanatory variable) of a fluctuation component are associated with an operational status (objective variable) of an electrical apparatus.

Note that there is also an operational status that does not have a feature value of a fluctuation component. For example, an operational status in which only the electrical apparatus without the occurrence of the fluctuation, and the like correspond thereto. Only a feature value of a reference component can be associated with such an operational status.

Here, an example of a means for acquiring a feature value of a fluctuation component will be described. For example, as described in the first exemplary embodiment, it is possible to extract a fluctuation component by dividing measurement data into groups according to each operational status group (in a case of the example of FIG. 7, groups 0 to 2), extracting a reference component from each operational status group, and subtracting the reference component from components of measurement data of a fluctuation-occurring group.

The fluctuation appears in a form of consumption current and power consumption fluctuating from a non-fluctuating state as a base to exceed a predetermined range (for example, a difference between a maximum value and a minimum value within a short period of time, for example, several seconds or several minutes, is equal to or greater than 50 mA and equal to or greater than 5 W). Thus, a component (reference component) during when the fluctuation is not occurring and a component of the fluctuation (fluctuation component) are included in the measurement data of the fluctuation-occurring group. Therefore, the fluctuation component is obtained by subtracting the reference component from the components (reference component+ fluctuation component) of the measurement data of the fluctuation-occurring group.

It is possible to acquire predetermined feature values (for example, features of the shape of a waveform, a phase difference between a reference wave and a harmonic, a difference in current values, a difference in power, and the like) from the fluctuation component obtained in this manner. Note that, in a case of the present exemplary embodiment, it is preferable to set a current waveform as a fluctuation component to acquire a feature value from the current waveform. Hereinafter, the reason will be described.

The inventors have newly found that the values of power, a current, and a power factor, and the like fluctuate when the fluctuation occurs, while the shape of a current waveform does not change. That is, the values of power, a current, and a power factor, and the like fluctuate in accordance with the state (for example, the usage rate of a CPU, or the like) of the fluctuation, while the shape of the current waveform is fixed regardless of the state of the fluctuation (for example, the usage rate of a CPU, or the like).

The inventors have further newly found that the shape of a current waveform is unique to each electrical apparatus (for example, a shape depending on the type of inverter).

Thus, the shapes of the current waveforms extracted as fluctuation components are the same as each other under the same operational status, and are unique shapes for each operational status.

Figure 16:
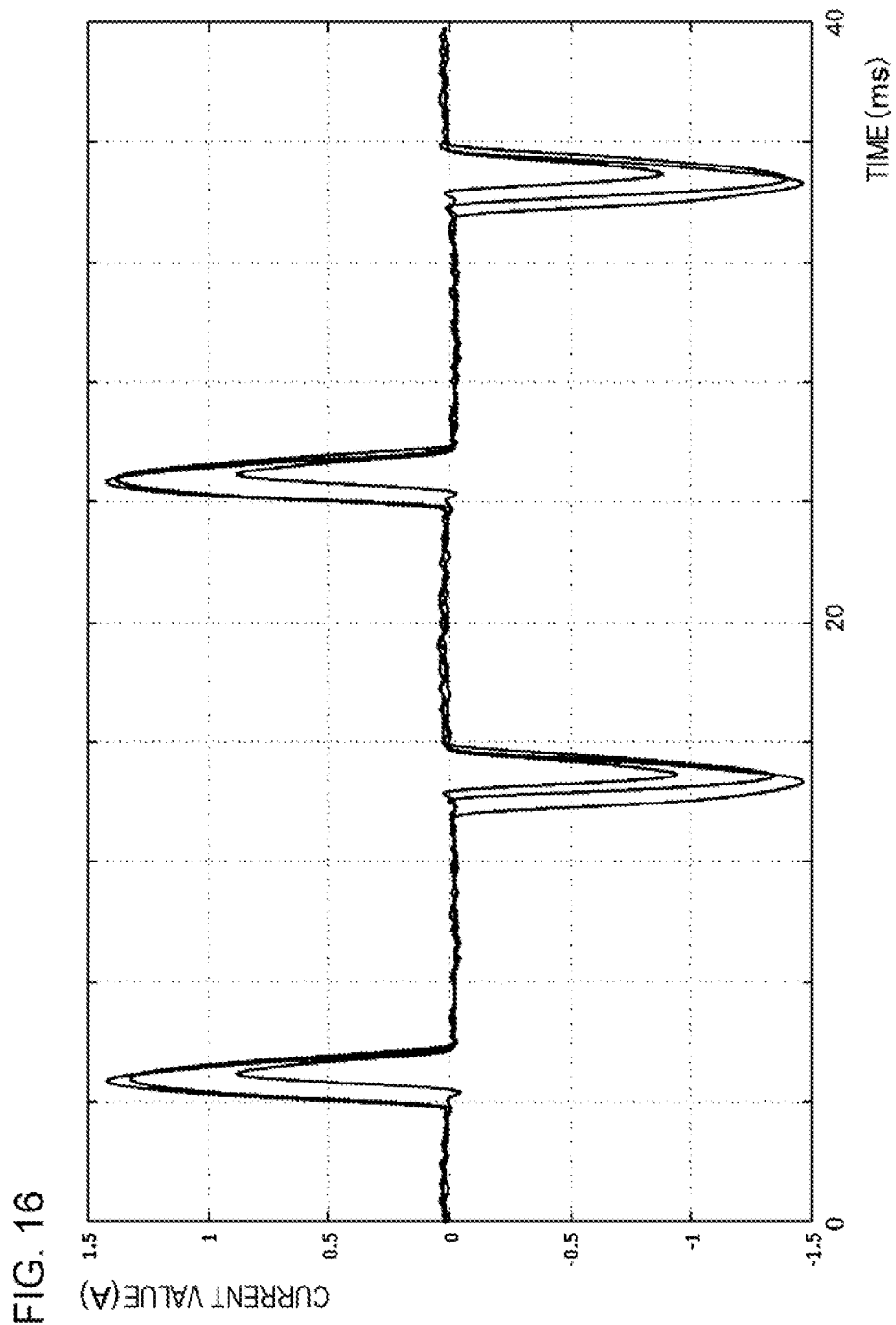
FIG. 16 is a diagram illustrating features of current waveforms related to fluctuation.

FIG. 16 is a diagram in which pieces of measurement data (current waveforms) having different amounts of power which are measured during the occurrence of the fluctuation are plotted in an overlapping manner under the same operational status. That is, FIG. 16 is a diagram in which pieces of measurement data (current waveforms) having different amounts of power belonging to the same operational status group are plotted in an overlapping manner. The inventors have confirmed that when the adjustment of a phase (adjustment of a deviation in a time axis direction) and the adjustment of amplitude (correction for enlarging or reducing a waveform and aligning amplitudes) are performed on these three current waveforms, the three current waveforms conform to each other. Thus, focusing on the current waveforms, it is possible to extract features of a fluctuation component common to all of the pieces of measurement data of the fluctuation-occurring group.

That is, when a fluctuation component is set to be a current waveform, it is possible to extract a feature value common to all of the pieces of measurement data of the fluctuation-occurring group, for each operational status group. On the other hand, in a case where a current, power, or the like that fluctuate depending on the state (for example, the usage rate of a CPU, or the like) of the fluctuation is adopted as a fluctuation component, it is not possible to extract a feature value common to all of the pieces of measurement data of the fluctuation-occurring group. In this case, features of fluctuation components of the operational status group are covered by a plurality of feature values.

Thus, when the fluctuation component is set to be a current waveform, it is possible to reduce the number of pieces of data to be handled (the number of pieces of teacher data and the like).

Note that, as illustrated in FIG. 16, a plurality of fluctuation components having the same shape of a current waveform but having different amplitudes may be extracted from the measurement data of the fluctuation-occurring group. In this case, an average of the plurality of fluctuation components may be set to be a representative of the operational status groups. In addition, a feature value may be acquired from a representative fluctuation component. In addition, as illustrated in FIG. 16, a plurality of fluctuation components having the same shape of a current waveform but having different phases may be extracted from the measurement data of the fluctuation-occurring group. In this case, correction for aligning the phases may be performed before the averaging is performed.

For example, a representative fluctuation component may be decided from the plurality of fluctuation components for each operational status group by using the following method.

First, a feature value $f_{i,j}$ of a fluctuation component (current waveform) (j denotes an id of the fluctuation component, and i denotes an id of a feature value extracted from the fluctuation component) is normalized by using a certain reference value $C(f_j)$ as expressed by Expression (2). Any value may be used as the reference value for the normalization as long as the value is a reference value such as power consumption, a maximum value or minimum value of a current waveform, an integrated value of the current waveform, or an effective value.

$$f_{i,j} \to f'_{i,j} = \frac{f_{i,j}}{C(f_j)} \quad (2)$$

After the normalization is performed, a weighted average is obtained by increasing a weight value of a current waveform having a small value of noise $N(f_j)$ and reducing a weight value of a fluctuation waveform having large noise. The current waveform obtained in this manner can be set to be a representative fluctuation component.

Note that the phase of a fluctuation component may be shifted in proportion to power or other values for normalization. In this case, first, a weighted average can be obtained after making the phases of respective fluctuation components (current waveforms) conform to each other by using the values for normalization. For example, a weight of the weighted average is set to be a reciprocal of the noise $N(f_j)$, a representative fluctuation component $F_i$ is obtained by the following Expression (3).

$$F_i = \frac{\sum_j (f'_{i,j}/N(f_j))}{\sum_j 1/N(f_j)} \quad (3)$$

The weight value used herein may be a value as in Expression (2), or may be a value obtained by multiplying the value of power n (n is a real number). In addition, the value may be previously set to have a form of a function by modeling a relationship between the magnitude of power and noise, or the like. The form of the model function used herein may be any form such as a physical model or machine learning as long as the noise is modeled. The above-described processing is performed for each operational status group, thereby obtaining a fluctuation component peculiar to each operational status group.

Referring back to FIG. 13, the inference-time reference component extraction unit 103 extracts a fluctuation component from the measurement data acquired by the inference-time acquisition unit 102, in addition to a reference component. For example, the inference-time reference component extraction unit 103 sets pieces of measurement data between the present point in time and a predetermined time before the present point in time to be objects to be processed, and performs division into groups (operational status groups) based on an operational status of an electrical apparatus and division into groups based on whether or not the fluctuation has occurred, by using the same method as in the first to third exemplary embodiments. As a result, data as illustrated in FIG. 8 is obtained. Thereafter, the inference-time reference component extraction unit 103 extracts a reference component and a fluctuation component of an operational status group to which measurement data at the present point in time belongs, in accordance with the above-described processing.

Note that there is also a case where a fluctuation component is not extracted from measurement data. For example, a fluctuation component is not extracted under an operational status in which only an electrical apparatus that does not include an inverter is operated. The inference-time reference component extraction unit 103 extracts only a reference component in a case where a fluctuation component is not extracted.

The inference-time feature value acquisition unit 104 acquires a feature value of each of the reference component and the fluctuation component extracted by the inference-time reference component extraction unit 103. Note that, in a case where the inference-time reference component extraction unit 103 extracts only a reference component, the inference-time feature value acquisition unit 104 acquires only a feature value of the reference component.

The inference unit 105 infers the operational status of an electrical apparatus on the basis of the teacher data stored in the feature value storage unit 101 and the feature value of the reference component and the feature value of the fluctuation component acquired by the inference-time feature value acquisition unit 104. The specific means for inference performed by the inference unit 105 is not particularly limited, and any method can be adopted. For example, machine learning such as a neural network may be used.

For example, the inference unit 105 can infer the operational status of an electrical apparatus on the basis of: the teacher data, including the feature value (explanatory variable) of the reference component and the operational status (objective variable) of the electrical apparatus which is stored in the feature value storage unit 101; and the feature value of the reference component acquired by the inference-time feature value acquisition unit 104. In addition, the inference unit 105 can infer an operational status of an electrical apparatus on the basis of: the teacher data, including the feature value (explanatory variable) of the fluctuation component and the operational status (objective variable) of the electrical apparatus which is stored in the feature value storage unit 101; and the feature value of the fluctuation component acquired by the inference-time feature value acquisition unit 104.

The inference unit 105 can infer an operational status of an electrical apparatus by using the above-described two inference processes. For example, in a case where an inference result was not obtained by preferentially using either one of the inference processes, the other inference process may be used.

According to the present exemplary embodiment described above, it is possible to implement the same advantageous effects as those in the third exemplary embodiment. In addition, an operational status of an electrical apparatus is inferred by combining a feature value of a reference component and a feature value of a fluctuation component with each other, and thus it is possible to expect to further improve the accuracy of inference.

For example, when there are a plurality of operational statuses such as the usage rate of a CPU in a predetermined electrical apparatus and a case where a plurality of electrical equipments are used, a fluctuation component is different for each operational status. That is, when operational contents (contents of processing being performed) obtained by division into groups are different from each other, fluctuation components in the groups of the respective operational contents are also different from each other. Thus, by dividing the data into groups according to each operational status to extract a fluctuation component, it is possible to clarify to which operational content each fluctuation component for each group corresponds.

Note that, also in the present exemplary embodiment, it is possible to adopt the same modification example (see FIG. 14) as the fourth exemplary embodiment.

Modification Example

In the above-described example, the division unit 21 divides measurement data into groups for respective operational statuses (operational status groups) on the basis of, for example, the above-described Expression (1), and then divides the measurement data into a fluctuation-occurring group and a non-fluctuation-occurring group for each operational status group. As a modification example, a process of performing division into groups for each operational status may not be performed.

In this case, the division unit 21 can set measurement data included in a range from equal to or greater than (peak value $P_k-\gamma_1$) to equal to or less than (peak value $P_k+\gamma_2$) to be the non-fluctuation-occurring group, and can classify the other pieces of data as the fluctuation-occurring group. In addition, it is possible to extract a fluctuation component by subtracting a reference component, extracted from the measurement data (measurement data of the non-fluctuation-occurring group) included in the range from equal to or greater than (peak value $P_k-\gamma_1$) to equal to or less than (peak value $P_k+\gamma_2$), from a predetermined component of measurement data (measurement data of the fluctuation-occurring group) in a range from greater than (peak value $P_k+\gamma_2$) to equal to or less than (peak value $P_{k+1}-\gamma_1$).

Fifth Exemplary Embodiment

A data processing device 100 according to the present exemplary embodiment is the same as that in the fourth exemplary embodiment in that an operational status of an electrical apparatus is inferred using a feature value of a reference component and a feature value of a fluctuation component, but the contents of an inference process is different from that in the fourth exemplary embodiment. Hereinafter, a description thereof will be given.

Figure 17:
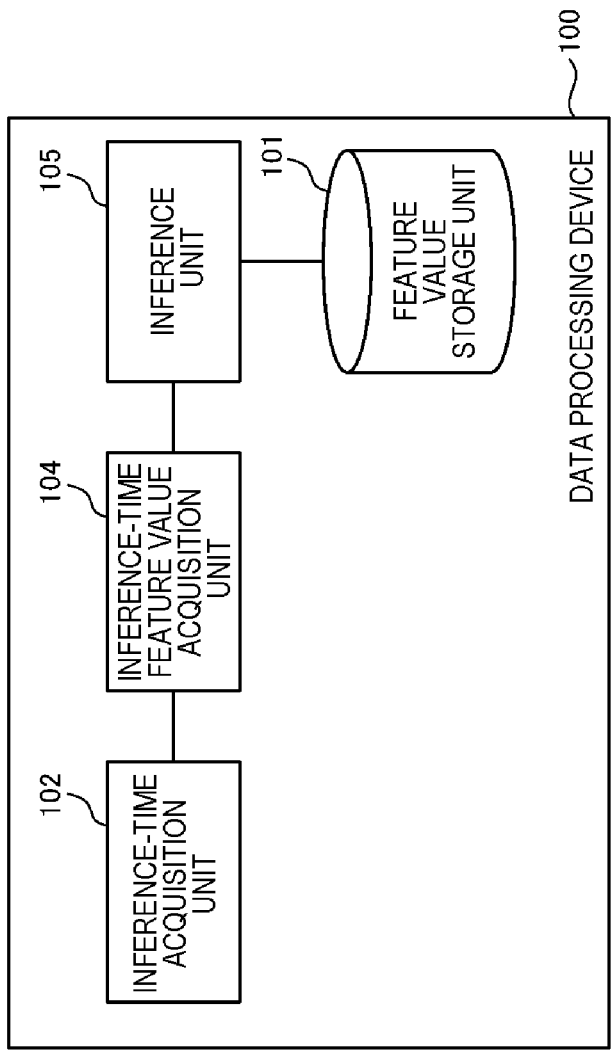
FIG. 17 illustrates an example of a functional block diagram of the data processing device according to the exemplary embodiment.

FIG. 17 illustrates an example of a functional block diagram according to the fifth exemplary embodiment. As illustrated in FIG. 17, the data processing device 100 includes a feature value storage unit 101, an inference-time acquisition unit 102, an inference-time feature value acquisition unit 104, and an inference unit 105. Configurations of the feature value storage unit 101 and the inference-time acquisition unit 102 are the same as those in the fourth exemplary embodiment.

The inference-time feature value acquisition unit 104 acquires a feature value of measurement data which is acquired by the inference-time acquisition unit 102. In the fourth exemplary embodiment, a reference component and a fluctuation component were extracted from measurement data, and a feature value was acquired from each of the components. On the other hand, in the fifth exemplary embodiment, a feature value is acquired from measurement data that may include both a reference component and a fluctuation component. The inference-time feature value acquisition unit 104 acquires a predetermined feature value by setting measurement data at the present point in time to be an object to be processed.

The inference unit 105 infers an operational status of an electrical apparatus on the basis of teacher data, including (1) "a feature value of a reference component" and (2) "a total feature value obtained by adding up a feature value of a reference component and a feature value of a fluctuation component" stored in the feature value storage unit 101, and a feature value of a measurement data which is acquired by the inference-time feature value acquisition unit 104. Specific means for inference performed by the inference unit 105 is not particularly limited, and any method can be adopted. For example, machine learning such as a neural network may be used.

In a case of the fifth exemplary embodiment, the feature value of the measurement data acquired by the inference-time feature value acquisition unit 104 is the feature value of (a reference component+a fluctuation component) or a feature value of a reference component. That is, in a case where the fluctuation is occurring at the present point in time, the feature value of the measurement data acquired by the inference-time feature value acquisition unit 104 is the feature value of (a reference component+a fluctuation component). On the other hand, in a case where the fluctuation is not occurring at the present point in time, the feature value of the measurement data acquired by the inference-time feature value acquisition unit 104 is a feature value of a reference component.

Consequently, the inference unit 105 infers the operational status by using the teacher data, including (1) "a feature value of a reference component" and (2) "a total feature value obtained by adding up a feature value of a reference component and a feature value of a fluctuation component" stored in the feature value storage unit 101.

The total feature value is generated by adding up a feature value of a reference component and a feature value of a fluctuation component (see FIG. 15) which are associated with the same operational status. Note that, after correction of a plurality of variations is performed on the feature value of the fluctuation component, the feature value of the reference component may be added to each of the corrected feature values of the fluctuation components, thereby generating a plurality of total feature values. As described above with reference to FIG. 9, in a case where a current waveform is adopted as a fluctuation component, the shapes of current waveforms (fluctuation components) extracted from measurement data conform to each other, but the phases or amplitudes thereof are different from each other. Consequently, in a case where a feature value related to the shape of the current waveform is held, correction taking a deviation of a phase or an amplitude into consideration may be performed on the current waveform of the fluctuation component before the addition to a feature value related to the shape of the current waveform which is a reference component. By such correction (adjustment of the phase or the amplitude), it is possible to reproduce feature values of a plurality of fluctuation components appearing in measurement data from a feature value of one fluctuation component which is held in advance.

According to the present exemplary embodiment described above, it is possible to implement the same advantageous effects as those in the third and fourth exemplary embodiments.

Hereinafter, an example of a reference configuration will be appended.

1. A data processing device including:
a measurement data acquisition unit that acquires measurement data indicating a temporal change in at least one of current consumption and power consumption of an electrical apparatus;
a reference component extraction unit that extracts a reference component of the current consumption and a reference component of the power consumption from the measurement data; and
a feature value acquisition unit that acquires a feature value of each reference component.

2. The data processing device according to 1,
wherein the reference component extraction unit includes a division unit that extracts each reference component on the basis of frequency of appearance of each value in the measurement data.

3. The data processing device according to 1,
wherein the reference component extraction unit includes a division unit that extracts each reference component on the basis of a width between front and back slopes of a peak appearing in data indicating frequency of appearance of each value in the measurement data.

4. The data processing device according to 1,
wherein the reference component extraction unit includes
a division unit that divides the measurement data into a fluctuation-occurring group in which fluctuation has occurred in the current consumption and the power consumption and a non-fluctuation-occurring group in which the fluctuation has not occurred in the current consumption and the power consumption, on the basis of frequency of appearance of each value, and
an extraction unit that extracts each reference component from the measurement data of the non-fluctuation-occurring group.

5. The data processing device according to 4,
wherein the division unit divides the measurement data into the fluctuation-occurring group and the non-fluctuation-occurring group, on the basis of frequency of appearance of a value of a component perpendicular to a direction of a fluctuation component vector.

6. The data processing device according to anyone of 1 to 5, further including:
a feature value storage unit that stores each feature value of each reference component; and
an updating unit that newly stores, in a case where the feature value of the reference component acquired by the feature value acquisition unit is not stored in the feature value storage unit, the feature value of the reference component in the feature value storage unit.

7. A data processing device including:
a feature value storage unit that stores a feature value of a reference component of current consumption and a feature value of a reference component of power consumption of an electrical apparatus as teacher data; and
an inference unit that infers an operational status of the electrical apparatus on the basis of the teacher data.

8. The data processing device according to 7,
wherein the feature value storage unit further stores a feature value of a fluctuation component of the current consumption and a feature value of a fluctuation component of the power consumption of the electrical apparatus as the teacher data, and
wherein the inference unit infers the operational status of the electrical apparatus on the basis of the teacher data related to the reference components and the teacher data related to the fluctuation components.

9. The data processing device according to 8,
wherein the inference unit infers the operational status of the electrical apparatus on the basis of a total feature value obtained by adding up the feature values of the reference components and the feature values of the fluctuation components.

10. A data processing method executed by a computer, the method including:
a measurement data acquisition step of acquiring measurement data indicating a temporal change in at least one of current consumption and power consumption of an electrical apparatus;
a reference component extraction step of extracting a reference component of the current consumption and a reference component of the power consumption from the measurement data; and
a feature value acquisition step of acquiring a feature value of each reference component.

10-2. The data processing method according to 10,
wherein the reference component extraction step includes a division step of extracting each reference component on the basis of frequency of appearance of each value in the measurement data.

10-3. The data processing method according to 10,
wherein the reference component extraction step includes a division step of extracting each reference component on the basis of a width between front and back slopes of a peak appearing in data indicating frequency of appearance of each value in the measurement data.

10-4. The data processing method according to 10,
wherein the reference component extraction step includes
a division step of dividing the measurement data into a fluctuation-occurring group in which fluctuation has occurred in the current consumption and the power consumption and a non-fluctuation-occurring group in which the fluctuation has not occurred in the current consumption and the power consumption, on the basis of frequency of appearance of each value, and
an extraction step of extracting each reference component from the measurement data of the non-fluctuation-occurring group.

10-5. The data processing method according to 10-4,
wherein the division step includes dividing the measurement data into the fluctuation-occurring group and the non-fluctuation-occurring group, on the basis of frequency of appearance of a value of a component perpendicular to a direction of a fluctuation component vector.

10-6. The data processing method according to any one of 10 to 10-5, the computer storing the feature values of the reference components, the method further including an updating step of newly storing, in a case where the feature value of the reference component acquired in the feature value acquisition step is not stored, the feature value of the reference component.

11. A data processing method executed by a computer, the computer storing a feature value of a reference component of current consumption and a feature value of a reference component of power consumption of an electrical apparatus as teacher data, the method including an inference step of inferring an operational status of the electrical apparatus on the basis of the teacher data.

11-2. The data processing method according to 11, the computer further storing a feature value of a fluctuation component of the current consumption and a feature value of a fluctuation component of the power consumption of the electrical apparatus as the teacher data, wherein the inference step includes inferring the operational status of the electrical apparatus on the basis of the teacher data related to each reference component and the teacher data related to each fluctuation component.

11-3. The data processing method according to 11-2, wherein the inference step further includes inferring the operational status of the electrical apparatus on the basis of a total feature value obtained by adding up the feature value of the reference component and the feature value of the fluctuation component.

12. A program causing a computer to function as:

a measurement data acquisition unit that acquires measurement data indicating a temporal change in at least one of current consumption and power consumption of an electrical apparatus;

a reference component extraction unit that extracts a reference component of the current consumption and a reference component of the power consumption from the measurement data; and a feature value acquisition unit that acquires a feature value of each reference component.

12-2. The program according to 12, causing the reference component extraction unit to function as a division unit that extracts each reference component on the basis of frequency of appearance of each value in the measurement data.

12-3. The program according to 12, causing the reference component extraction unit to function as a division unit that extracts each reference component on the basis of a width between front and back slopes of a peak appearing in data indicating frequency of appearance of each value in the measurement data.

12-4. The program according to 12, causing the reference component extraction unit to function as:

a division unit that divides the measurement data into a fluctuation-occurring group in which fluctuation has occurred in the current consumption and the power consumption and a non-fluctuation-occurring group in which the fluctuation has not occurred in the current consumption and the power consumption, on the basis of frequency of appearance of each value, and an extraction unit that extracts each reference component from the measurement data of the non-fluctuation-occurring group.

12-5. The program according to 12-4, causing the division unit to divide the measurement data into the fluctuation-occurring group and the non-fluctuation-occurring group, on the basis of frequency of appearance of a value of a component perpendicular to a direction of a fluctuation component vector.

12-6. The program according to any one of 12 to 12-5, causing the computer to further function as:

a feature value storage unit that stores each feature value of each reference component; and an updating unit that newly stores, in a case where the feature value of the reference component acquired by the feature value acquisition unit is not stored in the feature value storage unit, the feature value of the reference component in the feature value storage unit.

13. A program causing a computer to function as:

a feature value storage unit that stores a feature value of a reference component of current consumption and a feature value of a reference component of power consumption of an electrical apparatus as teacher data; and an inference unit that infers an operational status of the electrical apparatus on the basis of the teacher data.

13-2. The program according to 13, causing the feature value storage unit to further store a feature value of a fluctuation component of the current consumption and a feature value of a fluctuation component of power consumption of the electrical apparatus as the teacher data, and causing the inference unit to infer the operational status of the electrical apparatus on the basis of the teacher data related to each reference component and the teacher data related to each fluctuation component.

13-3. The program according to 13-2, causing the inference unit to infer the operational status of the electrical apparatus on the basis of a total feature value obtained by adding up the feature value of the reference component and the feature value of the fluctuation component.

14-1. A data processing device including:

a measurement data acquisition unit that acquires measurement data indicating a temporal change in at least one of current consumption and power consumption of an electrical apparatus;

a reference component extraction unit that extracts, from the measurement data, a reference component that does not include a fluctuation component related to fluctuation in the current consumption and the power consumption; and a feature value acquisition unit that acquires a feature value of the reference component.

14-2. The data processing device according to 14-1, wherein the reference component extraction unit includes a division unit that divides the measurement data into a fluctuation-occurring group and a non-fluctuation-occurring group, on the basis of frequency of appearance of a value, and an extraction unit that extracts the reference component from the measurement data of the non-fluctuation-occurring group.

14-3. The data processing device according to 14-2, wherein the division unit divides the measurement data into the fluctuation-occurring group and the non-fluctuation-occurring group, on the basis of frequency of appearance of a value of a component perpendicular to a direction of a fluctuation component vector.

14-4. The data processing device according to any one of 14-1 to 14-3, further including:

a feature value storage unit that stores each feature value of each reference component; and an updating unit that newly stores, in a case where the feature value of the reference component acquired by the feature value acquisition unit is not stored in the feature value storage unit, the feature value of the reference component in the feature value storage unit.

14-5. A data processing device including:
a feature value storage unit that stores, as teacher data, a feature value of a reference component that does not include a fluctuation component related to fluctuation in current consumption and power consumption;
an inference-time acquisition unit that acquires measurement data indicating a temporal change in at least one of the current consumption and the power consumption;
an inference-time reference component extraction unit that extracts the reference component from the measurement data;
an inference-time feature value acquisition unit that acquires a feature value of the reference component extracted by the inference-time reference component extraction unit; and
an inference unit that extracts an operational status of the electrical apparatus on the basis of the teacher data and the feature value of the reference component extracted by the inference-time feature value acquisition unit.

14-6. The data processing device according to 14-5,
wherein the feature value storage unit further stores a feature value of the fluctuation component as the teacher data,
wherein the data processing device further includes an inference-time fluctuation component extraction unit that extracts the fluctuation component from the measurement data,
wherein the inference-time feature value acquisition unit further acquires a feature value of the fluctuation component extracted by the inference-time fluctuation component extraction unit, and
wherein the inference unit infers the operational status of the electrical apparatus on the basis of the teacher data, and the feature value of the reference component and the feature value of the fluctuation component acquired by the inference-time feature value acquisition unit.

14-7. A data processing device including:
a feature value storage unit that stores a feature value of a fluctuation component related to fluctuation in current consumption and power consumption of an electrical apparatus, and a feature value of a reference component that does not include the fluctuation component;
an inference-time acquisition unit that acquires measurement data indicating a temporal change in at least one of the current consumption and the power consumption;
an inference-time feature value acquisition unit that acquires a feature value of the measurement data; and
an inference unit that infers an operational status of the electrical apparatus on the basis of teacher data including the feature value of the reference component and a total feature value obtained by adding up the feature value of the reference component and the feature value of the fluctuation component, and the feature value of the measurement data acquired by the inference-time feature value acquisition unit.

14-8. A data processing method executed by a computer, the method including:
a measurement data acquisition step of acquiring measurement data indicating a temporal change in at least one of current consumption and power consumption of an electrical apparatus;
a reference component extraction step of extracting a reference component that does not include a fluctuation component related to fluctuation in the current consumption and the power consumption from the measurement data; and
a feature value acquisition step of acquiring a feature value of the reference component.

14-9. A program causing a computer to function as:
a measurement data acquisition unit that acquires measurement data indicating a temporal change in at least one of current consumption and power consumption of an electrical apparatus;
a reference component extraction unit that extracts, from the measurement data, a reference component that does not include a fluctuation component related to fluctuation in the current consumption and the power consumption; and
a feature value acquisition unit that acquires a feature value of the reference component.

14-10. A data processing method executed by a computer, the computer storing a feature value of a reference component that does not include a fluctuation component related to fluctuation in current consumption and power consumption of an electrical apparatus as teacher data, the method including:
an inference-time acquisition step of acquiring measurement data indicating a temporal change in at least one of the current consumption and the power consumption;
an inference-time reference component extraction step of extracting the reference component from the measurement data;
an inference-time feature value acquisition step of acquiring the feature value of the reference component extracted in the inference-time reference component extraction step; and
an inference step of inferring an operational status of the electrical apparatus on the basis of the teacher data and the feature value of the reference component acquired in the inference-time feature value acquisition step.

14-11. A program causing a computer to function as:
a feature value storage unit that stores, as teacher data, a feature value of a reference component that does not include a fluctuation component related to fluctuation in current consumption and power consumption of an electrical apparatus;
an inference-time acquisition unit that acquires measurement data indicating a temporal change in at least one of the current consumption and the power consumption;
an inference-time reference component extraction unit that extracts the reference component from the measurement data;
an inference-time feature value acquisition unit that acquires the feature value of the reference component extracted by the inference-time reference component extraction unit; and
an inference unit that infers an operational status of the electrical apparatus on the basis of the teacher data and the feature value of the reference component acquired by the inference-time feature value acquisition unit.

14-12. A data processing method executed by a computer, the computer storing a feature value of a fluctuation component related to fluctuation in current consumption and power consumption of an electrical apparatus and a feature value of a reference component that does not include the fluctuation component, the method including:
an inference-time acquisition step of acquiring measurement data indicating a temporal change in at least one of the current consumption and the power consumption;
an inference-time feature value acquisition step of acquiring a feature value of the measurement data; and
an inference step of inferring an operational status of the electrical apparatus on the basis of teacher data including the feature value of the reference component and a total feature value obtained by adding up the feature value of the reference component and the feature value of the fluctuation component, and the feature value of the measurement data acquired in the inference-time feature value acquisition step.

14-13. A program causing a computer to function as:
a feature value storage unit that stores a feature value of a fluctuation component related to fluctuation in current consumption and power consumption of an electrical apparatus, and a feature value of a reference component that does not include the fluctuation component;
an inference-time acquisition unit that acquires measurement data indicating a temporal change in at least one of the current consumption and the power consumption;
an inference-time feature value acquisition unit that acquires a feature value of the measurement data; and
an inference unit that infers an operational status of the electrical apparatus on the basis of teacher data including the feature value of the reference component and a total feature value obtained by adding up the feature value of the reference component and the feature value of the fluctuation component, and the feature value of the measurement data acquired by the inference-time feature value acquisition unit.

The application is based on Japanese Patent Application No. 2015-071070 filed on Mar. 31, 2015, the content of which is incorporated herein by reference.

The invention claimed is:

1. A data processing device comprising:
a measurement data acquisition unit that acquires measurement data indicating a temporal change in at least one of current consumption and power consumption of an electrical apparatus;
a reference component extraction unit that extracts a reference component of the current consumption and a reference component of the power consumption from the measurement data, wherein each reference component is extracted on the basis of frequency of appearance of each value in the measurement data; and
a feature value acquisition unit that acquires a feature value of each reference component.

2. The data processing device according to claim 1, wherein the reference component extraction unit comprises a division unit that extracts each reference component on the basis of a width of a curve including a peak appearing in data indicating frequency of appearance of each value in the measurement data.

3. The data processing device according to claim 1, wherein the reference component extraction unit comprises:
a division unit that divides the measurement data into a fluctuation-occurring group in which fluctuation in the current consumption and the power consumption has occurred and a non-fluctuation-occurring group in which the fluctuation in the current consumption and the power consumption has not occurred, on the basis of frequency of appearance of each value; and
an extraction unit that extracts each reference component from the measurement data of the non-fluctuation-occurring group.

4. The data processing device according to claim 3, wherein the division unit divides the measurement data into the fluctuation-occurring group and the non-fluctuation-occurring group, on the basis of frequency of appearance of a value of a component perpendicular to a direction of a fluctuation component vector.

5. The data processing device according to claim 1, further comprising:
a feature value storage unit that stores each feature value of each reference component; and
an updating unit that newly stores, in a case where the feature value of the reference component acquired by the feature value acquisition unit is not stored in the feature value storage unit, the feature value of the reference component in the feature value storage unit.

6. A data processing device comprising:
a feature value storage unit that stores as teacher data, a feature value of a reference component extracted from measurement data indicating a temporal change in at least one of current consumption and power consumption of an electrical apparatus on the basis of frequency of appearance of each value in the measurement data; and
an inference unit that infers an operational status of the electrical apparatus on the basis of the teacher data.

7. The data processing device according to claim 6, wherein the feature value storage unit further stores a feature value of a fluctuation component of the current consumption and a feature value of a fluctuation component of the power consumption of the electrical apparatus as the teacher data, and
wherein the inference unit infers the operational status of the electrical apparatus on the basis of the teacher data related to the reference components and the teacher data related to the fluctuation components.

8. The data processing device according to claim 7, wherein the inference unit infers the operational status of the electrical apparatus on the basis of a total feature value obtained by adding up the feature value of the reference component and the feature value of the fluctuation component.

9. A data processing method executed by a computer, the method comprising:
acquiring measurement data indicating a temporal change in at least one of current consumption and power consumption of an electrical apparatus;
extracting a reference component of the current consumption and a reference component of the power consumption from the measurement data, wherein each reference component is extracted on the basis of frequency of appearance of each value in the measurement data; and
acquiring a feature value of each reference component.

10. A data processing method executed by a computer, the computer storing as teacher data, a feature value of a reference component extracted from measurement data indicating a temporal change in at least one of current consumption and power consumption of an electrical apparatus on the basis of frequency of appearance of each value in the measurement data;
inferring an optional status of the electrical apparatus on the basis of the teacher data.

11. A program causing a computer to function as:
a measurement data acquisition unit that acquires measurement data indicating a temporal change in at least one of current consumption and power consumption of an electrical apparatus;
a reference component extraction unit that extracts a reference component of the current consumption and a reference component of the power consumption from the measurement data, wherein each reference component is extracted on the basis of frequency of appearance of each value in the measurement data; and
a feature value acquisition unit that acquires a feature value of each reference component.

12. A program causing a computer to function as:
- a feature value storage unit that stores as teacher data, a feature value of a reference component extracted from measurement data indicating a temporal change in at least one of current consumption and power consumption of an electrical apparatus on the basis of frequency of appearance of each value in the measurement data; and
- an inference unit that infers an operational status of the electrical apparatus on the basis of the teacher data.

* * * * *

UNITED STATES PATENT AND TRADEMARK OFFICE
CERTIFICATE OF CORRECTION

PATENT NO. : 10,712,374 B2
APPLICATION NO. : 15/562540
DATED : July 14, 2020
INVENTOR(S) : Takahiro Toizumi et al.

Page 1 of 1

It is certified that error appears in the above-identified patent and that said Letters Patent is hereby corrected as shown below:

In the Specification

Column 9, Expression 1, Description of Exemplary Embodiments, Line 16; Delete "$(P_k - \Delta P_k) \leq P < (P_{k+1} - \Delta P_{k+1})$" and insert --$(P_k - \Delta P_k) \leqq P < (P_{k+1} - \Delta P_{k+1})$-- therefor Signed and Sealed this
Seventeenth Day of November, 2020

Andrei Iancu
*Director of the United States Patent and Trademark Office*